(12) United States Patent
Kim et al.

(10) Patent No.: US 10,714,440 B2
(45) Date of Patent: Jul. 14, 2020

(54) FAN-OUT SEMICONDUCTOR PACKAGE

(71) Applicant: SAMSUNG ELECTRONICS CO., LTD., Suwon-si (KR)

(72) Inventors: Han Kim, Suwon-Si (KR); Kyung Moon Jung, Suwon-Si (KR); Seok Hwan Kim, Suwon-Si (KR); Kyung Ho Lee, Suwon-Si (KR); Kang Heon Hur, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/042,644

(22) Filed: Jul. 23, 2018

(65) Prior Publication Data

US 2018/0331054 A1 Nov. 15, 2018

Related U.S. Application Data

(63) Continuation of application No. 15/402,383, filed on Jan. 10, 2017, now Pat. No. 10,403,588.

(30) Foreign Application Priority Data

Sep. 29, 2016 (KR) .................. 10-2016-0125841

(51) Int. Cl.
*H01L 23/00* (2006.01)
(52) U.S. Cl.
CPC ............. *H01L 24/04* (2013.01); *H01L 24/02* (2013.01); *H01L 24/05* (2013.01); *H01L 24/19* (2013.01);
(Continued)

(58) Field of Classification Search
CPC . H01L 2224/02379; H01L 2224/02331; H01L 2224/0235; H01L 2224/05008
See application file for complete search history.

(56) References Cited

U.S. PATENT DOCUMENTS 6,387,734 B1 * 5/2002 Inaba .................. H01L 23/3114
257/701
7,989,356 B2 8/2011 Bao et al.
(Continued)

FOREIGN PATENT DOCUMENTS

CN 103168358 A 6/2013
CN 104299952 A 1/2015
(Continued)

OTHER PUBLICATIONS

Office Action issued in corresponding Japanese Patent Application No. 2017-005907, dated Jul. 10, 2018.
(Continued)

*Primary Examiner* — Robert G Bachner
*Assistant Examiner* — Molly K Reida
(74) *Attorney, Agent, or Firm* — Sughrue Mion, PLLC

(57) ABSTRACT

A fan-out semiconductor package includes a semiconductor chip having an active surface on which a connection pad is disposed and an inactive surface opposing the active surface, an encapsulant sealing at least a portion of the inactive surface, a first connection member disposed on the active surface and including a redistribution layer and a first via electrically connecting the connection pad to the redistribution layer, a passivation layer disposed on the first connection member, and an under-bump metal layer including an external connection pad disposed on the passivation layer and a second via connecting the external connection pad to the redistribution layer. In a vertical direction, the first and second vias are disposed within the external connection pad and do not overlap each other.

19 Claims, 13 Drawing Sheets

(52) U.S. Cl.
CPC ............... *H01L 2224/0235* (2013.01); *H01L 2224/02331* (2013.01); *H01L 2224/02375* (2013.01); *H01L 2224/02379* (2013.01); *H01L 2224/02381* (2013.01); *H01L 2224/0401* (2013.01); *H01L 2224/05008* (2013.01); *H01L 2224/05091* (2013.01); *H01L 2224/05092* (2013.01); *H01L 2224/13024* (2013.01); *H01L 2224/16225* (2013.01); *H01L 2224/18* (2013.01); *H01L 2224/32225* (2013.01); *H01L 2224/73204* (2013.01); *H01L 2924/15311* (2013.01); *H01L 2924/18162* (2013.01); *H01L 2924/3512* (2013.01); *H01L 2924/35121* (2013.01)

(56) References Cited

U.S. PATENT DOCUMENTS

| | | | |
|---|---|---|---|
| 9,142,514 | B2 | 9/2015 | Camacho et al. |
| 2004/0183211 | A1 | 9/2004 | Alcoe et al. |
| 2004/0183212 | A1 | 9/2004 | Alcoe |
| 2005/0011674 | A1 | 1/2005 | Oprysko et al. |
| 2007/0200239 | A1 | 8/2007 | Su |
| 2009/0085192 | A1 | 4/2009 | Hsu et al. |
| 2010/0237506 | A1* | 9/2010 | Brunnbauer ............ H01L 24/11 257/773 |
| 2011/0198762 | A1* | 8/2011 | Scanlan ................ H01L 21/568 257/793 |
| 2011/0221055 | A1 | 9/2011 | Lin et al. |
| 2012/0013021 | A1 | 1/2012 | Kobayashi et al. |
| 2012/0261166 | A1 | 10/2012 | Oh et al. |
| 2013/0249101 | A1 | 9/2013 | Lin et al. |
| 2014/0048944 | A1* | 2/2014 | Lin .................... H01L 23/562 257/773 |
| 2014/0131856 | A1 | 5/2014 | Do et al. |
| 2015/0021758 | A1 | 1/2015 | Tsai et al. |
| 2015/0187742 | A1 | 7/2015 | Kwon et al. |
| 2016/0043047 | A1 | 2/2016 | Shim et al. |
| 2017/0141056 | A1* | 5/2017 | Huang .................... H01L 24/20 |

FOREIGN PATENT DOCUMENTS

| | | |
|---|---|---|
| JP | 2004-289150 A | 10/2004 |
| JP | 2004-327958 A | 11/2004 |
| JP | 2012-039090 A | 2/2012 |
| JP | 2014-167987 A | 9/2014 |
| KR | 10-2013-0132162 A | 12/2013 |
| KR | 10-2013-0132163 A | 12/2013 |
| KR | 10-2014-0060435 A | 5/2014 |
| KR | 10-2016-0024379 A | 3/2016 |
| TW | 201242442 A | 10/2012 |
| TW | 201618196 A | 5/2016 |
| WO | 2010/137420 A1 | 12/2010 |
| WO | 2011/058879 A1 | 5/2011 |
| WO | 2012/012338 A1 | 1/2012 |
| WO | 2015/026344 A1 | 2/2015 |

OTHER PUBLICATIONS

Japanese Office Action dated Feb. 19, 2019 issued in Japanese Patent Application No. 2017-005907 (with English translation).
Taiwanese Office Action issued in corresponding Taiwanese Patent Application No. 106101471, dated Jun. 12, 2018, with English Translation.
Non-Final Office Action issued in related parent U.S. Appl. No. 15/402,383, dated on May 16, 2018.
Korean Office Action dated Feb. 26, 2019 issued in Korean Patent Application No. 10-2016-0125841 (with English translation).
Office Action issued in corresponding Korean Patent Application No. 10-2016-0125841, dated Aug. 22, 2018.

* cited by examiner

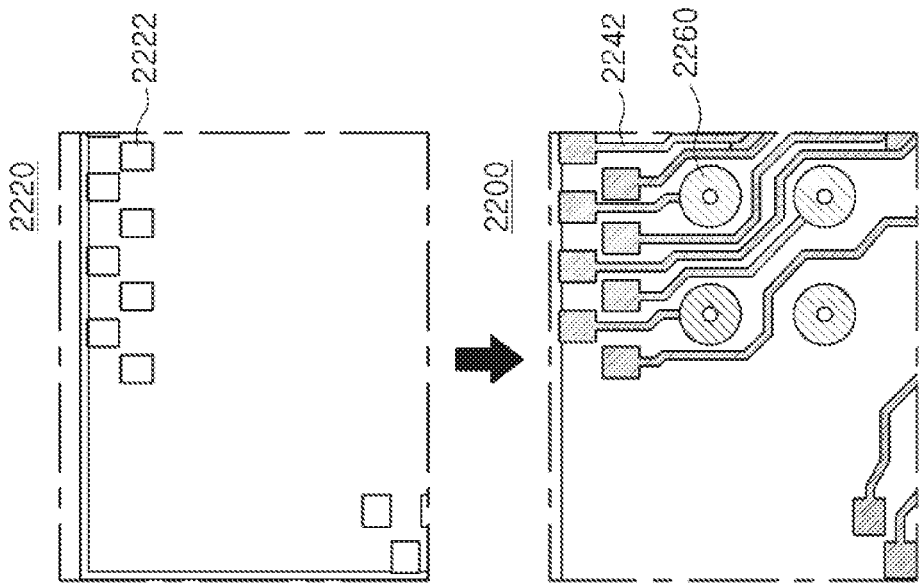
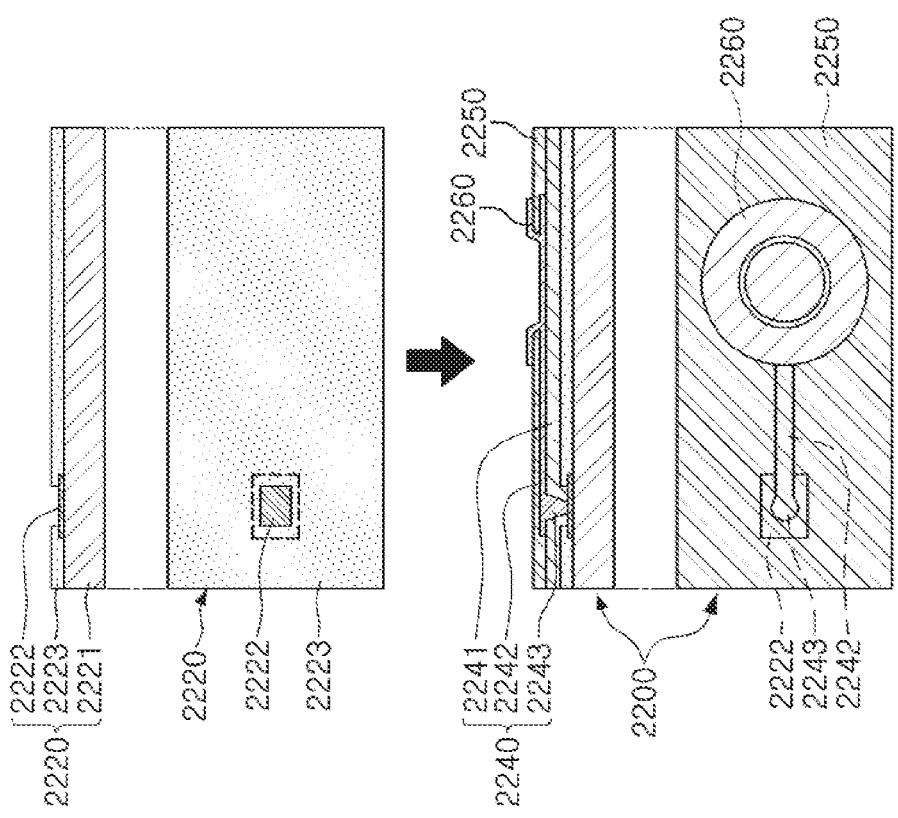
FIG. 3A
FIG. 3B

FAN-OUT SEMICONDUCTOR PACKAGE

CROSS-REFERENCE TO RELATED APPLICATION(S)

This application is a Continuation of U.S. patent application Ser. No. 15/402,383 filed on Jan. 10, 2017, which claims benefit of priority to Korean Patent Application No. 10-2016-0125841 filed on Sep. 29, 2016 in the Korean Intellectual Property Office, the disclosure of which are incorporated herein by reference in their entirety.

TECHNICAL FIELD

The present disclosure relates to a semiconductor package, and more particularly, to a fan-out semiconductor package in which a connection terminal may be extended beyond a region in which a semiconductor chip is disposed.

BACKGROUND

A principal trend in the technical development of semiconductor chips has been reducing the size of components. Thus, in the field of packaging, a plurality of pins have been required to be implemented, while being miniaturized, according to a rapid increase in demand for small-sized semiconductor chips and the like.

In order to meet such demand, a fan-out semiconductor package has been proposed as a packaging technology. In the case of such a fan-out semiconductor package, connection terminals may also be redistributed beyond a region in which a semiconductor chip is disposed, such that a plurality of pins may be implemented while being miniaturized.

SUMMARY

An aspect of the present disclosure is to provide a fan-out semiconductor package having sufficient reliability with respect to stress transferred through a connection terminal and the like.

According to an aspect of the present disclosure, a via of a redistribution layer and a via of an under-bump metal layer may not overlap each other above a region in which an external connection pad of the under-bump metal layer is disposed.

According to an aspect of the present disclosure, a fan-out semiconductor package includes a semiconductor chip having an active surface on which a connection pad is disposed and an inactive surface opposing the active surface, an encapsulant sealing at least a portion of the inactive surface of the semiconductor chip, a first connection member disposed on the active surface of the semiconductor chip and including a redistribution layer and a first via electrically connecting the connection pad of the semiconductor chip to the redistribution layer, a passivation layer disposed on the first connection member, and an under-bump metal layer including an external connection pad disposed on the passivation layer and a second via connecting the external connection pad to the redistribution layer. In a direction perpendicular to the active surface of the semiconductor chip, the first via and the second via are disposed within the external connection pad and do not overlap each other.

BRIEF DESCRIPTION OF DRAWINGS

The above and other aspects, features and other advantages of the present disclosure will be more clearly understood from the following detailed description taken in conjunction with the accompanying drawings, in which:

FIG. 3A shows a cross-sectional view and a plan view schematically illustrating a fan-in semiconductor package before and after packaging thereof;

FIG. 3B shows a cross-sectional view and a plan view schematically illustrating a fan-in semiconductor package before and after packaging thereof;

DETAILED DESCRIPTION

Figure 1:
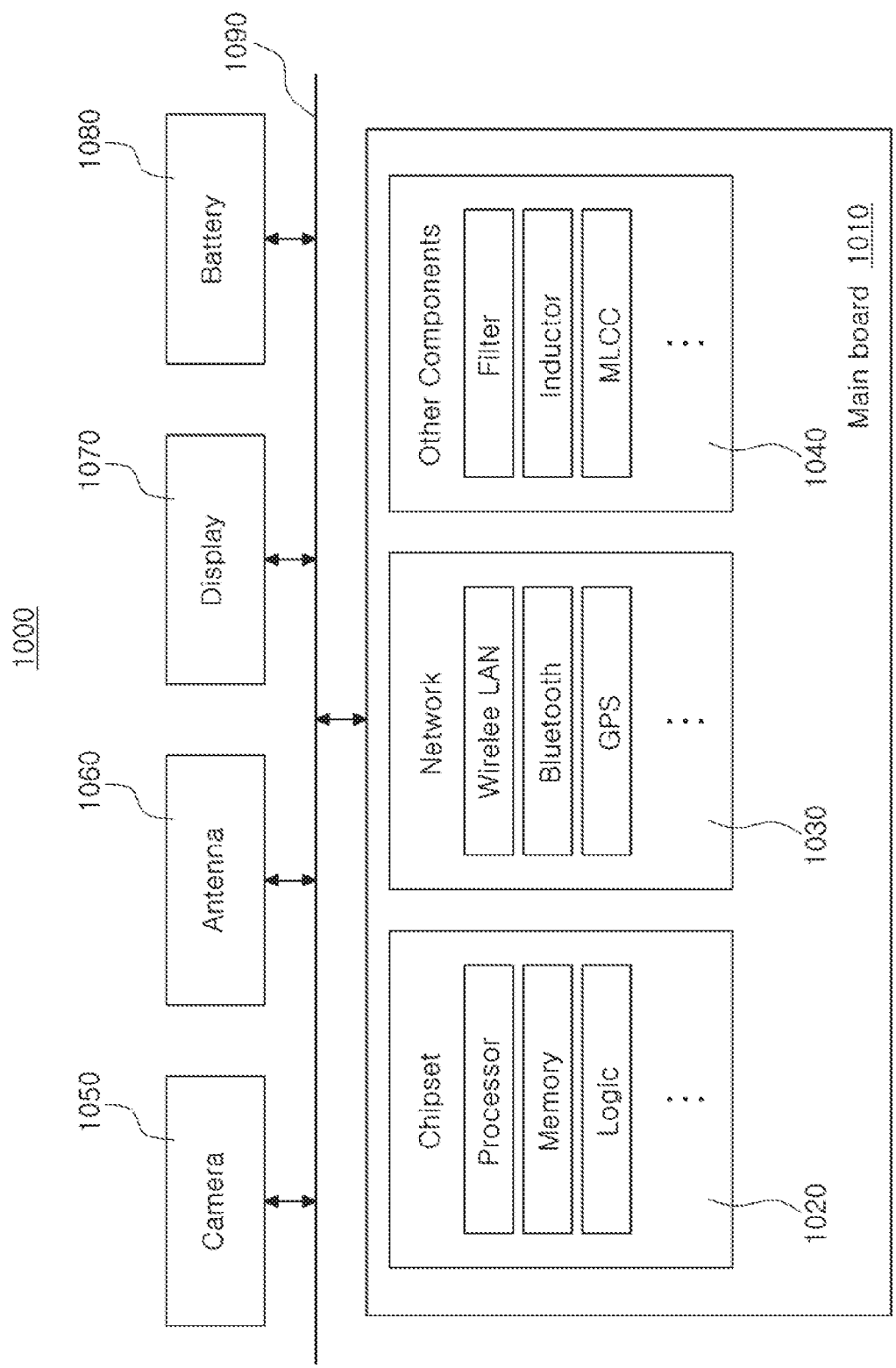
FIG. 1 is a block diagram schematically illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Electronic Device

FIG. 1 is a block diagram schematically illustrating an example of an electronic device system.

Referring to FIG. 1, an electronic device 1000 may accommodate a main board 1010 therein. In the main board 1010, chip-related components 1020, network-related components 1030, other components 1040, and the like may be physically and/or electrically connected to one another, and may also be combined with other components to be described later to thus form various signal lines 1090.

Examples of the chip-related components 1020 may include a memory chip such as a volatile memory, for example, a dynamic random access memory (DRAM), a non-volatile memory, for example, a read only memory (ROM), a flash memory, and the like; an application processor chip such as a central processor, for example, a central processing unit (CPU), a graphics processor, for example, a graphic processing unit (GPU), a digital signal processor, a cryptographic processor, a microprocessor, a microcontroller, and the like; a logic chip such as an analog-to-digital converter, an application-specific IC (ASIC), and the like; and the like, but are not limited thereto. Thus, different types of chip-related components may also be included therein. In addition, the chip-related components 1020 may also be combined with each other.

Examples of the network-related components 1030 may include Wi-Fi (IEEE 802.11 family and the like), WiMAX (IEEE 802.16 family and the like), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G, and other optional wireless and wired protocols provided thereafter, but are not limited thereto. In addition, any one of a number of other wireless or wired standards or protocols may be included therein. Further, the network-related components 1030 may also be combined with the chip-related components 1020.

Examples of other components 1040 may include a high-frequency inductor, a ferrite inductor, a power inductor, a ferrite bead, a low temperature co-firing ceramic (LTCC), an electro-magnetic interference (EMI) filter, and a multilayer ceramic condenser (MLCC), and the like, but are not limited thereto. In addition, passive components having various other usages, and the like, may be included therein. In addition, other components 1040 may also be combined with the chip-related components 1020 and/or the network-related components 1030.

Depending on the type of the electronic device 1000, the electronic device 1000 may include other components that may or may not be physically and/or electrically connected to the main board 1010. Examples of other components may include, for example, a camera 1050, an antenna 1060, a display 1070, a battery 1080, an audio codec (not shown), a video codec (not shown), a power amplifier (not shown), a compass (not shown), an accelerometer (not shown), a gyroscope (not shown), a speaker (not shown), a large capacity storage device, for example a hard disk drive (not shown), a compact disc (CD) drive (not shown), a digital versatile disk (DVD) drive (not shown), and the like, but are not limited thereto. In addition, other components used for various usages, and the like, may be included depending on the type of the electronic device 1000.

The electronic device 1000 may be a smartphone, a personal digital assistant, a digital video camera, a digital still camera, a network system, a computer, a monitor, a tablet PC, a laptop computer, a netbook computer, a television set, a video game, a smartwatch, an automotive component, or the like, but is not limited thereto. In addition, other optional electronic devices for processing data may be used.

Figure 2:
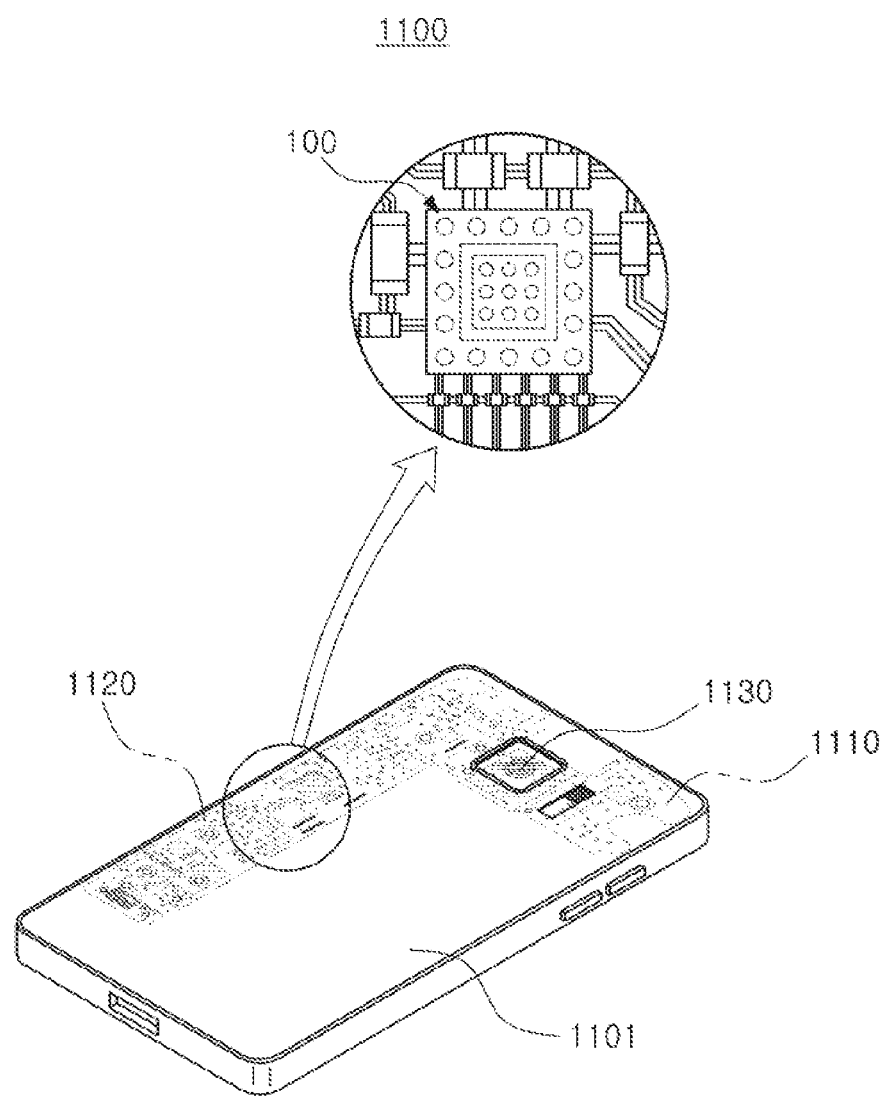
FIG. 2 is a perspective view schematically illustrating an example of an electronic device.

FIG. 2 is a perspective view schematically illustrating an example of an electronic device.

Referring to FIG. 2, a semiconductor package may be used in various electronic devices as described above, for various purposes. For example, a main board 1110 may be accommodated within a body portion 1101 of a smartphone 1100, and various components 1120 may be physically and/or electrically connected to the main board 1110. In addition, other components, such as a camera 1130 and the like, which may or may not be physically and/or electrically connected to the main board 1010, may be accommodated within the body portion 1101. A portion of the components 1120 may be chip-related components, and a semiconductor package 100 may be, for example, an application processor, but is not limited thereto. The electronic device is not necessarily limited to the smartphone 1100, but may be a different type of electronic device as described above.

Semiconductor Package

A semiconductor chip generally has a large number of microelectric circuits integrated therein, but may not serve as a finished semiconductor product in itself and may be damaged by external physical or chemical impacts. Thus, a semiconductor chip itself may not be used as it is, but may be packaged and used in electronic devices and the like in a package state.

Semiconductor packaging may be required due to a difference in circuit widths between a semiconductor chip and a main board of an electronic device in terms of electrical connectivity. In detail, in the case of the semiconductor chip, the size of a connection pad and spacing between the connection pads are very fine, while in the case of the main board used in electronic devices, the size of a component mounting pad and an interval between component mounting pads may be significantly large as compared to the scale of the semiconductor chip. Thus, it may be difficult to directly mount a semiconductor chip on such a main board, and thus, a packaging technology in which a difference in circuit widths thereof may be reduced may be required.

Semiconductor packages manufactured by such a packaging technique may be classified as fan-in semiconductor packages and fan-out semiconductor packages, depending on the structure and usage thereof.

Hereinafter, a fan-in semiconductor package and a fan-out semiconductor package will be described in more detail with reference to the accompanying drawings.

Fan-In Semiconductor Package

FIG. 3A shows a cross-sectional view and a plan view schematically illustrating a fan-in semiconductor package before and after packaging thereof and FIG. 3B shows a cross-sectional view and a plan view schematically illustrating a fan-in semiconductor package before and after packaging.

Figure 4:
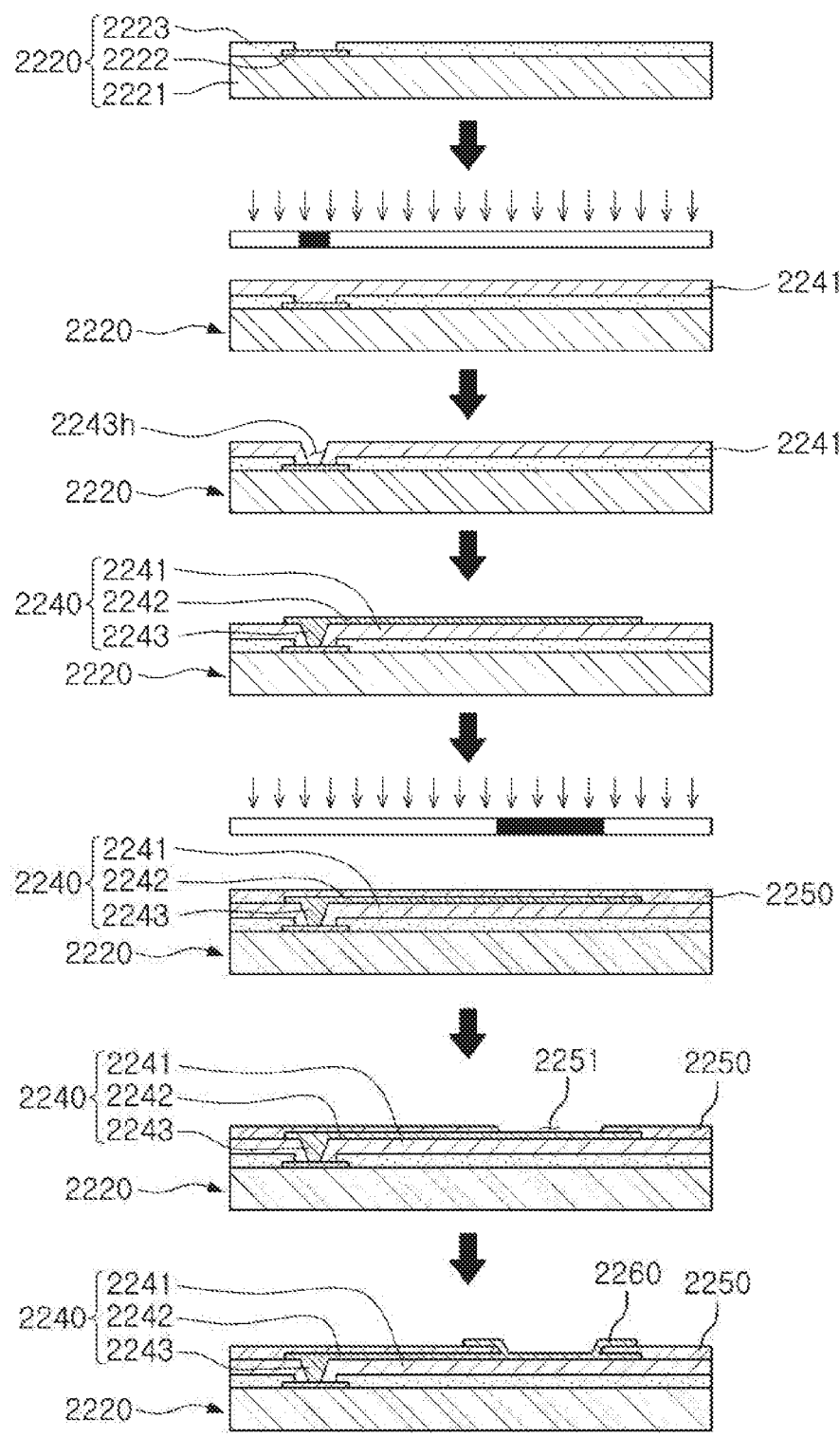
FIG. 4 is a cross-sectional view schematically illustrating a packaging process of a fan-in semiconductor package.

FIG. 4 is a cross-sectional view schematically illustrating a packaging process of a fan-in semiconductor package.

With reference to the drawings, a semiconductor chip 2220 may include a body portion 2221 including silicon (Si), germanium (Ge), gallium arsenide (GaAs), and the like, a connection pad 2222 formed on one surface of the body portion 2221 and including a conductive material of aluminum (Al) or the like, and a passivation film 2223, such as an oxide film, a nitride film, or the like, formed on one surface of the body portion 2221 and covering at least a portion of the connection pad 2222, and may be an integrated circuit IC in a bare state. In this case, since the connection pad 2222 is relatively very small, the integrated circuit (IC) may be difficult to be mounted on a middle-level printed circuit board (PCB) as well as on a main board of an electronic device and the like.

Thus, in order to redistribute the connection pad 2222, a connection member 2240 having the same size as the semiconductor chip 2220 may be formed on the semiconductor chip 2220. The connection member 2240 may be formed by forming an insulating layer 2241 using an insulating material such as a photosensitive insulating resin (PID) on the semiconductor chip 2220, forming a via hole 2243h allowing the connection pad 2222 to be exposed, and forming a distribution pattern 2242 and a via 2243. Then, a passivation layer 2250 may be formed to protect the connection member 2240, an opening 2251 may be formed, and then, an under-bump metal layer 2260 and the like may be formed. For example, through a series of processes, a fan-in semiconductor package 2200 including, for example, the semiconductor chip 2220, the connection member 2240, the passivation layer 2250, and the under-bump metal layer 2260 may be manufactured.

As described above, the fan-in semiconductor package may be a package type in which connection pads of a semiconductor chip, for example, input/output (I/O) terminals are all disposed inside the device, and the fan-in semiconductor package may have appropriate electrical characteristics and relatively low manufacturing costs. Thus, a number of devices for smartphones have been manufactured in the form of a fan-in semiconductor package, and in detail, fan-in semiconductor packages are being developed to realize compactness and fast signal transmission.

However, in the case of the fan-in semiconductor package, space limitation that all of the I/O terminals should be disposed inside the semiconductor chip may be problematic. Thus, such a structure may be difficult to be applied to a semiconductor chip having a large number of I/O terminals or a semiconductor chip having a small size. In addition, due to this vulnerability, the fan-in semiconductor package may not be directly mounted on a main board of an electronic device. For example, even in a case in which the size and spacing of the I/O terminals of the semiconductor chip are enlarged by a redistribution process, the size and an interval therebetween may not be enough to be directly mounted on an electronic device main board.

Figure 5:
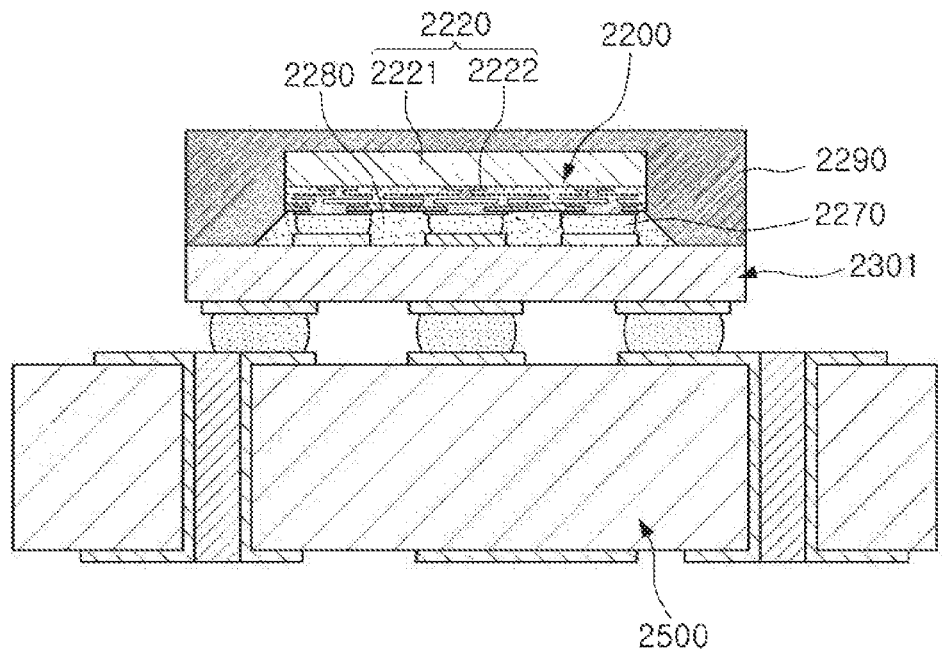
FIG. 5 is a cross-sectional view schematically illustrating a case in which a fan-in semiconductor package is mounted on an interposer substrate to ultimately be mounted on a main board of an electronic device.

FIG. 5 is a cross-sectional view schematically illustrating a case in which a fan-in semiconductor package is mounted on an interposer substrate to resultantly be mounted on a main board of an electronic device.

Figure 6:
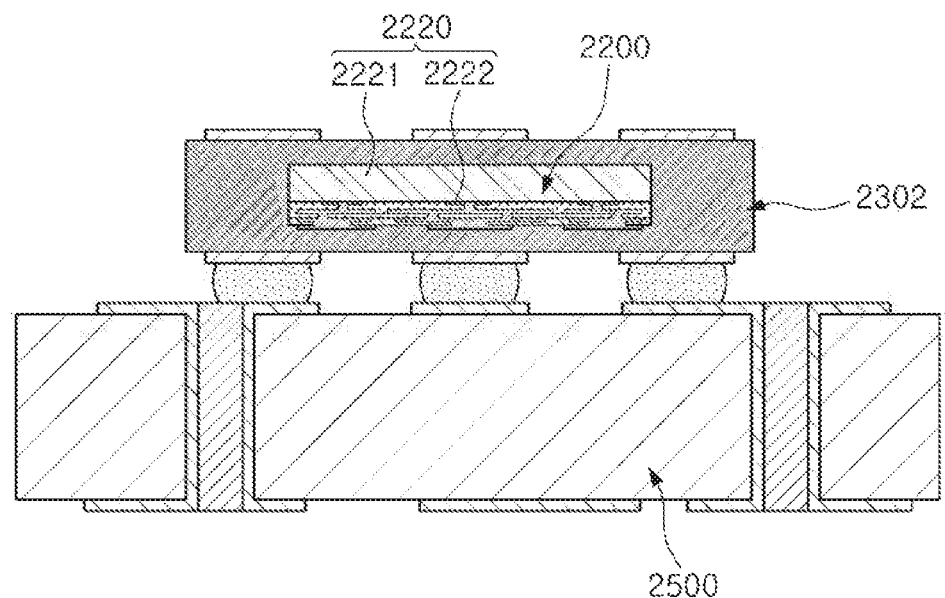
FIG. 6 is a cross-sectional view schematically illustrating a case in which a fan-in semiconductor package is embedded in an interposer substrate to ultimately be mounted on a main board of an electronic device.

FIG. 6 is a cross-sectional view schematically illustrating a case in which a fan-in semiconductor package is embedded in an interposer substrate to resultantly be mounted on a main board of an electronic device.

Referring to the drawings, the fan-in semiconductor package 2200 may have a structure in which connection pads 2222 of a semiconductor chip 2220, for example, I/O terminals are redistributed through an interposer substrate 2301, and resultantly, may be mounted on a main board 2500 of an electronic device in a state in which the fan-in semiconductor package 2200 is mounted on the interposer substrate 2301. In this case, a solder ball 2270 and the like may be fixed by an underfill resin 2280 or the like, and an outer portion thereof may be covered with a molding material 2290 or the like. Alternatively, the fan-in semiconductor package 2200 may also be embedded in a separate interposer substrate 2302, and in the embedding state thereof, the connection pads 2222 of the semiconductor chip 2220, for example, the I/O terminals may be redistributed by the interposer substrate 2302, and may be resultantly mounted on the main board 2500 of the electronic device.

As such, since the fan-in semiconductor package is difficult to be directly mounted on the main board of the electronic device, the fan-in semiconductor package may need to be mounted on a separate interposer substrate and then remounted on a main board of an electronic device via re-passing through a packaging process, or may be mounted on a main board of an electronic device and used in a state in which it is embedded in an interposer substrate.

Fan-Out Semiconductor Package

Figure 7:
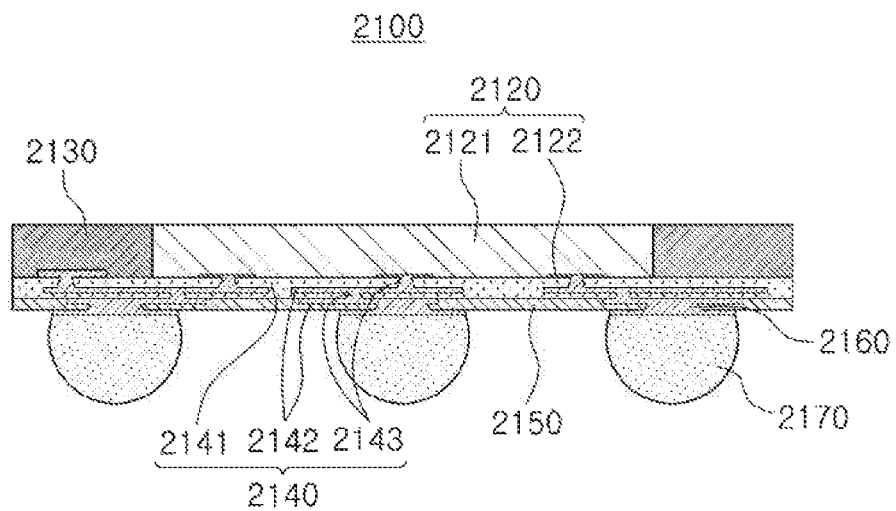
FIG. 7 is a schematic cross-sectional view of a fan-out semiconductor package.

FIG. 7 is a schematic cross-sectional view of a fan-out semiconductor package.

With reference to FIG. 7, in the case of a fan-out semiconductor package 2100, for example, an outer side of a semiconductor chip 2120 may be protected by an encapsulant 2130, and a connection pad 2122 of the semiconductor chip 2120 may be redistributed outwardly of the semiconductor chip 2120 by a connection member 2140. In this case, a passivation layer 2150 may further be formed on the connection member 2140, and an under-bump metal layer 2160 may be formed in the opening of the passivation layer 2150. A solder ball 2170 may further be formed on the under-bump metal layer 2160. The semiconductor chip 2120 may be an integrated circuit (IC) including a body portion 2121, a connection pad 2122, a passivation film (not shown), and the like. The connection member 2140 may include an insulating layer 2141, a redistribution layer 2142 formed on the insulating layer 2141, and a via 2143 electrically connecting the connection pad 2122, the redistribution layer 2142, and the like to each other.

As described above, the fan-out semiconductor package may be formed in a form in which I/O terminals are redistributed to the outside of the semiconductor chip through the connection member formed on the semiconductor chip. As described above, in the fan-in semiconductor package, all of the I/O terminals of the semiconductor chip should be disposed inside the semiconductor chip, and in this case, if the element size is reduced, the ball size and pitch need to be reduced. Thus, a standardized ball layout may not be used. On the other hand, in the fan-out semiconductor package, the I/O terminals may be redistributed to the outside of the semiconductor chip through the connection member formed on the semiconductor chip such that a standardized ball layout may be used as it is, even in the case in which the size of the semiconductor chip is reduced. Thus, the fan-out semiconductor package may be mounted on a main board of an electronic device without using a separate interposer substrate as will be described later.

Figure 8:
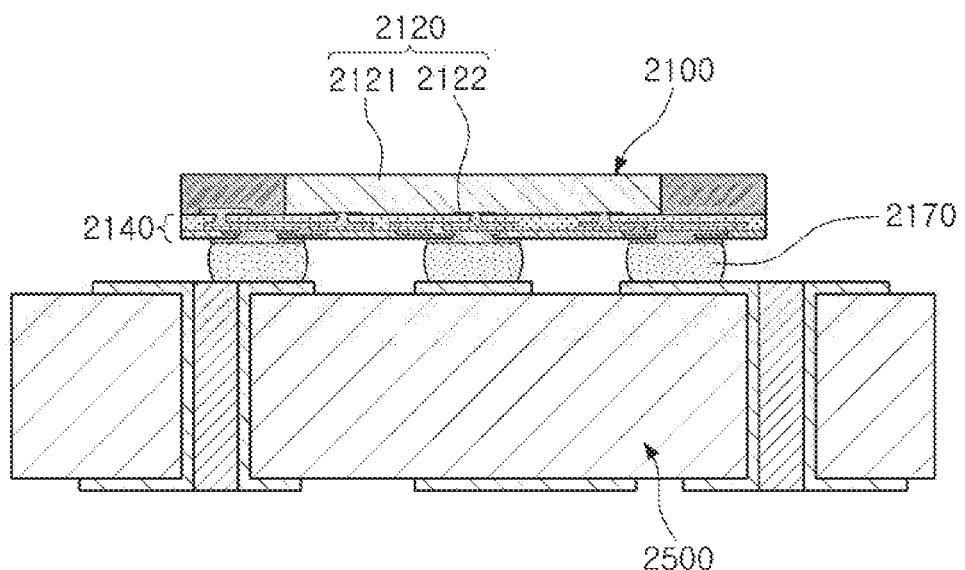
FIG. 8 is a cross-sectional view schematically illustrating a case in which a fan-out semiconductor package is mounted on a main board of an electronic device.

FIG. 8 is a cross-sectional view schematically illustrating a case in which a fan-out semiconductor package is mounted on a main board of an electronic device.

Referring to FIG. 8, a fan-out semiconductor package 2100 may be mounted on a main board 2500 of an electronic device through solder balls 2170 or the like. For example, as described above, since the fan-out semiconductor package 2100 may be provided with a connection member 2140 disposed on a semiconductor chip 2120 thereof to allow a connection pad 2122 to be redistributed to a fan-out area exceeding a size of the semiconductor chip 2120, a standardized ball layout may be used as it is, and as a result, the fan-out semiconductor package 2100 may be mounted on the main board 2500 of the electronic device without a separate interposer substrate or the like.

As such, since the fan-out semiconductor package may be mounted on the main board of the electronic device without a separate interposer substrate, a thickness of the fan-out semiconductor package may be reduced as compared to that of the fan-in semiconductor package using the interposer substrate. Thus, the miniaturization and slimness of a semiconductor package may be implemented. In addition, the fan-out semiconductor package may have excellent thermal characteristics and electrical characteristics to be suitable for mobile products. In addition, the fan-out semiconductor package may be implemented more compactly than a general package-on-package (POP) type using a printed circuit board (PCB), and may be implemented to prevent the occurrence of a bending phenomenon and problems caused thereby.

On the other hand, the fan-out semiconductor package refers to a package technology for mounting a semiconductor chip on a main board of an electronic device or the like and for protecting a semiconductor chip from external impacts, and is based on a technical idea different from that of a printed circuit board (PCB), such as an interposer substrate or the like, including a fan-in semiconductor package embedded therein, in terms of the scale, the usage, and the like.

Hereinafter, a fan-out semiconductor package having sufficient reliability with respect to stress transmitted through connection terminals and the like will be described with reference to the drawings.

Figure 9:
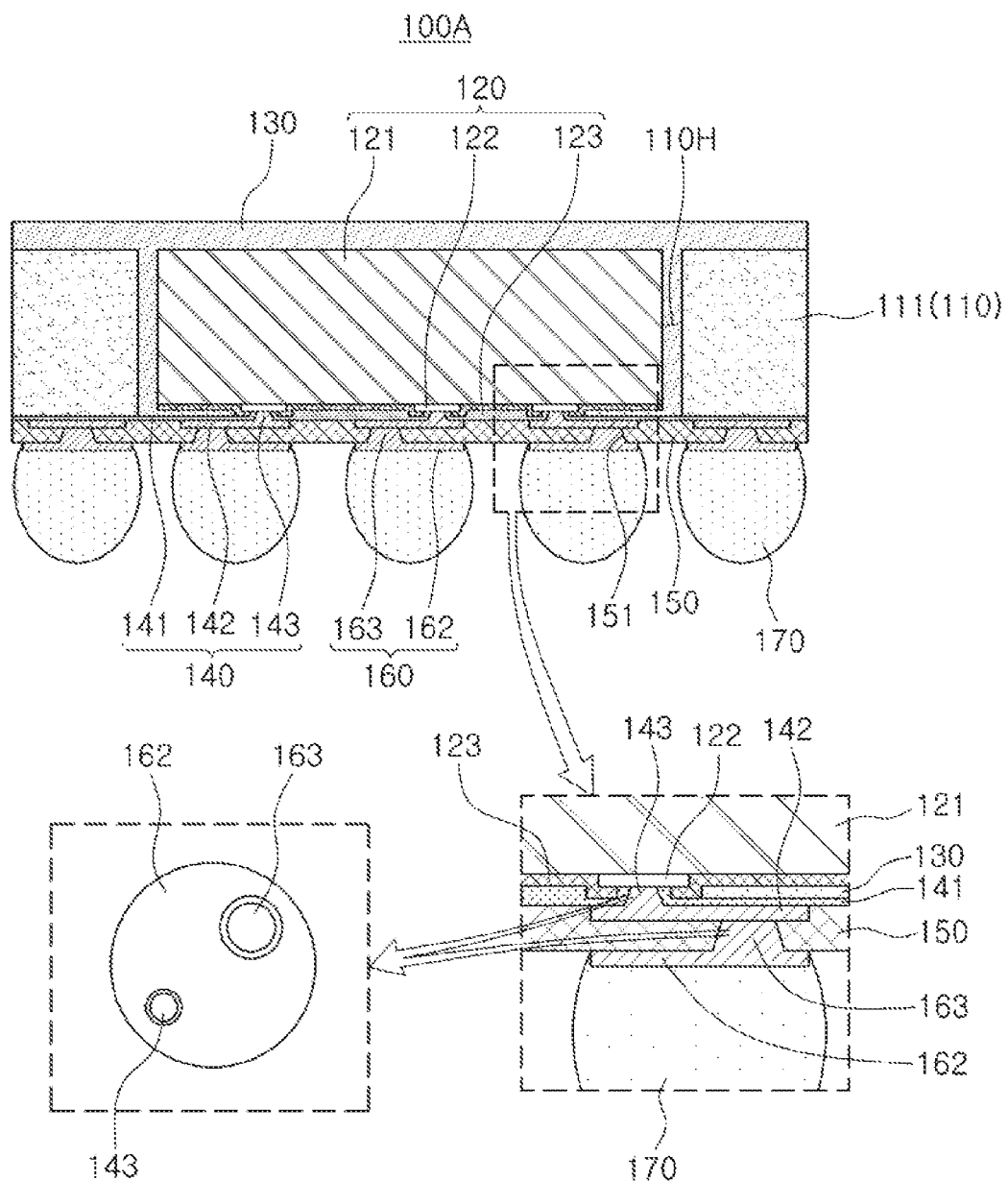
FIG. 9 schematically illustrates an example of a fan-out semiconductor package.

FIG. 9 schematically illustrates an example of a fan-out semiconductor package.

Figure 10:
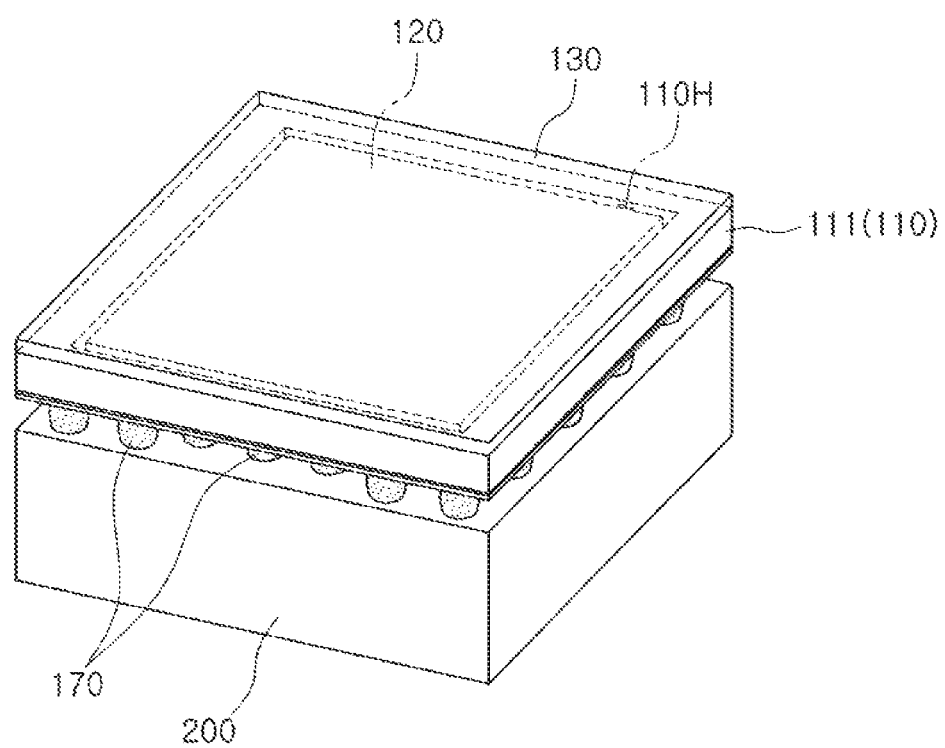
FIG. 10 is a schematic perspective view of the fan-out semiconductor package of FIG. 9.

FIG. 10 is a schematic perspective view of the fan-out semiconductor package of FIG. 9.

Referring to the drawings, a fan-out semiconductor package 100A according to an exemplary embodiment may include a semiconductor chip 120 having an active surface on which a connection pad 122 is disposed and an inactive surface opposing the active surface, an encapsulant 130 sealing at least a portion of the inactive surface of the semiconductor chip 120, a connection member 140 disposed on the active surface of the semiconductor chip 120, a passivation layer 150 disposed on the connection member 140, and an under-bump metal layer 160 disposed on the passivation layer 150. The connection member 140 may include a redistribution layer 142 and a first via 143 electrically connecting the connection pad 122 of the semiconductor chip 120 and the redistribution layer 142 to each other. The under-bump metal layer 160 may include an external connection pad 162 formed on the passivation layer 150 and a second via 163 electrically connecting the external connection pad 162 and the redistribution layer 142 to each other. In a direction perpendicular to the active surface of the semiconductor chip 120, the first and second vias 143 and 163 may be located in the external connection pad 162, and may overlap the external connection pad 162, and may not overlap each other.

A main board of an electronic device generally has a thermal expansion coefficient less than that of an insulating layer of a connection member of a fan-out semiconductor package. For example, the main board may have a thermal expansion coefficient of about 17 ppm/° C. to about 18 ppm/° C., and the insulating layer of the connection member may be principally formed using a photosensitive material, and thus, may have a thermal expansion coefficient of about 60 ppm/° C. or higher. Thus, for example, when the fan-out semiconductor package is mounted on the main board, stress and the like transferred through a connection terminal, for example, a solder ball, due to a difference in thermal expansion coefficients may be directly applied to the fan-out semiconductor package, which may be problematic in terms of board-level reliability. For example, there may be a problem of interfacial delamination in vias of a redistribution layer connected to connection pads of a semiconductor chip and a problem of cracking of connection terminals in a thermal cycle or impact reliability test process.

On the other hand, in order to prevent cracking of a connection terminal, introduction of an under-bump metal layer between the connection terminal and the redistribution layer may be considered. In the case of connecting the connection terminal and the redistribution layer by using the under-bump metal layer between the connection terminal and the redistribution layer, a reliability problem of the connection terminal, for example, cracking of the connection terminal may be reduced to some extent. However, there remains a limitation to improving the reliability of vias in the redistribution layer.

However, in the case of the fan-out semiconductor package 100A according to an exemplary embodiment, a size of a second via 163 of the under-bump metal layer 160 may be reduced while introducing the under-bump metal layer 160 therein, to thus be prevented from overlapping the first via 143 of the connection member 140. As such, for example, when the first via 143 and the second via 163 are arranged so as not to overlap each other above a region in which the external connection pad 162 is disposed, since stress applied to the second via 163 may not be directly transferred to the first via 143, stress applied to the first via 143 may be significantly reduced. Thus, reliability of the first via 143 as well as reliability of a connection terminal 170 may be improved, which may be provided based on the case in which in terms of cross sections, a projection plane of the first via 143 and the second via 163 are located within a region of a projection plane of the external connection pad 162, while in a case in which the projection plane of the first via 143 and/or the second via 163 are disposed outside the region of the projection plane of the external connection pad 162, negative effects, such as a path of signal transmission being excessively long, may occur. Here, the projection plane is a plane parallel to the active surface of the semiconductor chip 120.

On the other hand, a volume of the second via 163 may be larger than that of the first via 143. If the second via 163 is smaller in volume than the first via 143, since the second via 163 may be structurally weaker than the first via 143, reliability of the second via 163 may be problematic. In addition, the first via 143, the second via 163, and the external connection pad 162 may be arranged in such a manner that central axes thereof are offset from one another. A central axis of an element passes a center of the element and is perpendicular to the active surface of the semiconductor chip 120. Through this arrangement, stress dispersion may be effectively carried out while avoiding an overlap of the first via 143 and the second via 163 in a direction perpendicular to the active surface of the semiconductor chip 120.

The first via 143 may be contacted to the connection pad 122 of the semiconductor chip 120. The connection pad 122 generally includes aluminum (Al) and the first via 143 generally includes copper (Cu). For example, in a manner different therefrom, in a case in which both of the connection pad 122 and the first via 143 contain heterogeneous materials, reliability thereof may be decreased. In addition, the first via 143 and the second via 163 in the above-described arrangement may be disposed in an outer peripheral region of the semiconductor chip 120, in detail, in an outer corner region of the semiconductor chip 120, to prevent stress easily occurring therein. In addition, the arrangement described above may only be introduced in a portion in which stress is significantly problematic, and a normal stack form may be applied to remaining portions, as needed.

Although not illustrated in the drawing, a plurality of first vias 143 may also be disposed above a region in which each external connection pad 162 is disposed. For example, a plurality of first vias 143 may be disposed to correspond to a single external connection pad 162. At least one of the plurality of first vias 143 may be a via for signal (S) connection, and the remainder may be vias for power (P) and/or ground (G) connections. For example, when a plurality of first vias 143 are disposed as described above, the above description may be applied to respective vias.

Hereinafter, configurations included in the fan-out semiconductor package 100A according to an exemplary embodiment will be described in further detail.

The semiconductor chip 120 may be an integrated circuit (IC) in which hundreds to millions of devices are integrated in a single chip. The integrated circuit may be, for example, an application processor chip such as a central processing unit (CPU), a graphic processing unit (GPU), a digital signal processor, a cryptographic processor, a microprocessor, a microcontroller, or the like, but is not limited thereto. The semiconductor chip 120 may be formed on the basis of an active wafer. In this case, silicon (Si), germanium (Ge), gallium arsenide (GaAs), or the like may be used as a base material for a body portion 121. Various types of circuits may be disposed in the body portion 121. The connection pad 122 may be provided for an electrical connection of the semiconductor chip 120 to other components. As a material of the connection pad 122, a conductive material such as aluminum (Al) or the like may be used without particular limitation. A passivation film 123 allowing the connection pad 122 to be exposed may be formed on the body portion 121. The passivation film 123 may be an oxide film or a nitride film, or may be a double layer of an oxide film and a nitride film. A lower surface of the connection pad 122 may have a step with respect to a lower surface of an encapsulant 130 via the passivation film 123, such that the encapsulant 130 may be prevented from bleeding to the lower surface of the connection pad 122 to some extent. An insulating film (not shown) or the like may also be further disposed on other required positions.

The encapsulant 130 may protect the semiconductor chip 120. A sealing form thereof is not particularly limited and any form capable of covering at least a portion of an inactive surface of the semiconductor chip 120 may be employed. For example, the encapsulant 130 may cover a second connection member 110 described later and the inactive surface of the semiconductor chip 120, and may fill a space between a wall surface of a through hole 110H described later and a side surface of the semiconductor chip 120. In addition, the encapsulant 130 may also be provided in at least a portion of a space between the passivation film 123 of the semiconductor chip 120 and the connection member 140. On the other hand, by filling the through hole 110H with the encapsulant 130, the encapsulant 130 may serve as an adhesive and reduce buckling, according to a detailed material thereof.

A material of the encapsulant 130 is not particularly limited. For example, an insulating material may be used as the encapsulant 130. In this case, as the insulating material, a material including an inorganic filler and an insulating resin, for example, a thermosetting resin such as an epoxy resin, a thermoplastic resin such as polyimide, or a resin formed by including a reinforcing material such as an inorganic filler therein, in detail, an Ajinomoto build-up film (ABF), FR-4, bismaleimide triazine (BT), a photo imagable dielectric resin (PID) or the, like may be used. A molding material such as EMC or the like, known commonly in the art, may also be used. A material in which a thermosetting resin or a thermoplastic resin, and an inorganic filler are impregnated with a core material, such as glass fiber, glass cloth, glass fabric or the like, for example, a prepreg or the like may be used.

The connection member 140 may be provided for redistribution of the connection pad 122 of the semiconductor chip 120. Tens or hundreds of connection pads 122 having various functions may be redistributed via the connection members 140 and may be physically and/or electrically connected to external devices through connection terminals 170 described later according to functions. The connection member 140 may include an insulating layer 141, a redistribution layer 142 disposed on the insulating layer 141, and a first via 143 electrically connecting the redistribution layer 142 to the connection pad 122 while penetrating through the insulating layer 141. The connection member 140 may be configured of a plurality of layers as required.

As a material of the insulating layer 141, an insulating material may be used. In this case, a photosensitive insulating material such as a PID resin may be used as the insulating material, but is not limited thereto. For example, the insulating layer 141 may be a photosensitive insulating layer, as needed. In addition, for example, when the insulating layer 141 has photosensitive properties, a thickness of the insulating layer 141 may be further reduced, and a fine pitch of the first via 143 may be more easily obtained. The insulating layer 141 may be a photosensitive insulating layer including an insulating resin and an inorganic filler. For example, when the insulating layer 141 is configured of multiple layers, materials of the multiple layers may be identical to each other or may be different from each other as needed. When the insulating layer 141 is provided as a multiple layer structure as described above, the insulating layer 141 may be formed in an integrated form according to a process, and thus, boundaries thereof may not be discernable therebetween.

The redistribution layer 142 may serve to substantially redistribute the connection pad 122. As a material of the redistribution layer 142, a conductive material such as copper (Cu), aluminum (Al), silver (Ag), tin (Sn), gold (Au), nickel (Ni), lead (Pb), titanium (Ti), or alloys thereof may be used. The redistribution layer 142 may perform various functions according to a design of a relevant layer. For example, a ground (GND) pattern, a power (PoWeR: PWR) pattern, a signal (S) pattern, and the like may be used therefor. In this case, the signal (S) pattern may indicate patterns for various signals, for example, data signals, except for aground (GND) pattern, a power (PWR) pattern, and the like. Further, a via pad or the like may be included. A surface treatment layer (not shown) may be formed on surfaces of pad patterns or the like exposed through openings 151 formed in the passivation layer 150, in the redistribution layers 142 of the connection member 140. The surface treatment layer (not shown) may be formed using, for example, electrolytic gold plating, electroless gold plating, OSP or electroless tin plating, electroless silver plating, electroless nickel plating/replacement gold plating, DIG plating, HASL, or the like.

The first via 143 may electrically connect the connection pad 122, the redistribution layer 142 and the like formed in different layers to each other, and as a result, may form an electrical path in the fan-out semiconductor package 100A. As a material of the first via 143, a conductive material such as copper (Cu), aluminum (Al), silver (Ag), tin (Sn), gold (Au), nickel (Ni), lead (Pb), titanium (Ti), or alloys thereof may be used. The first via 143 may be fully filled with a conductive material, or a conductive material may be formed along a wall of the via. In addition, any shape known in the art, such as a tapered shape, a cylindrical shape, or the like may be applied.

The passivation layer 150 may protect the redistribution layer 142 of the connection member 140 from external physical and chemical damage or the like. The passivation layer 150 may have the opening 151 allowing at least a portion of the redistribution layer 142 of the connection member 140 to be exposed. In the case of the opening as described above, tens to thousands of openings may be formed in the passivation layer 150. A material of the passivation layer 150 is not particularly limited. As the material of the passivation layer 150, for example, an Ajinomoto build-up film (ABF) or the like including an inorganic filler and an insulating resin, but not including glass, fiber, glass cloth, or glass fabric, may be used. For example, when ABF or the like is used, a weight percentage of the inorganic filler included in the passivation layer 150 may be greater than the weight percentage of an inorganic filler included in the insulating layer 141 of the connection member 140. Reliability thereof may be improved under the conditions as described above. However, exemplary embodiments are not limited thereto, and a known PID or solder resist may be used.

The under-bump metal layer 160 may improve connection reliability of the connection terminal 170 and may improve board-level reliability of the fan-out semiconductor package 100A. The under-bump metal layer 160 may be electrically connected to the redistribution layer 142 of the connection member 140 exposed through the opening 151 of the passivation layer 150. The under-bump metal layer 160 may be formed in and on the opening 151 of the passivation layer 150 via a metalization method commonly known in the art, using a known conductive material, for example, a metal, but is not limited thereto.

The under-bump metal layer 160 may include an external connection pad 162 formed on the passivation layer 150 and a second via 163 electrically connecting the external connection pad 162 to the redistribution layer 142. The external connection pad 162 and the second via 163 may include a conductive material such as copper (Cu), aluminum (Al), silver (Ag), tin (Sn), gold (Au), nickel (Ni), lead (Pb), titanium (Ti), alloys thereof, or the like. According to a manufacturing method, the external connection pad 162 and the second via 163 may be integrated, and thus, a boundary therebetween may not be discernable from each other.

The connection terminal 170 may be an additional configuration for physically and/or electrically connecting the fan-out semiconductor package 100A externally. For example, the fan-out semiconductor package 100A may be mounted on a main board of an electronic device via the connection terminal 170. The connection terminal 170 may be formed of a conductive material, for example, a solder or the like, which is provided by way of example, and thus, a material thereof is not particularly limited. The connection terminal 170 may be a land, a ball, a pin, or the like. The connection terminal 170 may be formed to have a multilayer structure or a single layer structure. For example, when the connection terminal 170 has a multilayer structure, the connection terminal 170 may include a copper pillar and solder, and when the connection terminal 170 has a monolayer structure, the connection terminal 170 may include tin-silver solder or copper, which are provided by way of example, and thus, are not limited thereto.

The number, spacing, arrangement type, and the like of the connection terminals 170 are not particularly limited and may be sufficiently modified according to design specifications. For example, the number of the connection terminals 170 may be tens to thousands, depending on the number of the connection pads 122 of the semiconductor chip 120, and may be more or less. When the connection terminal 170 is a solder ball, the connection terminal 170 may cover a side of the under-bump metal layer 160 extended on one side of the passivation layer 150, and connection reliability thereof may be further improved.

At least one of the connection terminals 170 may be disposed in a fan-out region. The fan-out region may indicate an area outside a region in which the semiconductor chip 120 is disposed. For example, a fan-out semiconductor package 100A according to an exemplary embodiment may be a fan-out package. The fan-out package may have excellent reliability as compared to a fan-in package, may have multiple input/output (I/O) terminals, and may facilitate implementation of 3D interconnection. In addition, compared with a ball grid array (BGA) package, a land grid array (LGA) package and the like, a fan-out semiconductor package may be mounted on an electronic device without a separate substrate, and thus, may be manufactured to have a reduced package thickness and may be excellent in price competitiveness.

The fan-out semiconductor package 100A according to an exemplary embodiment may further include a second connection member 110 having a through hole 110H as required. The second connection member 110 may maintain the rigidity of the fan-out semiconductor package 100A according to a detailed material thereof and may serve to secure uniformity of the thickness of the encapsulant 130. In the through hole 110H, the semiconductor chip 120 may be disposed to be spaced apart from the second connection member 110 by a predetermined distance. The periphery of a side of the semiconductor chip 120 may be surrounded by the second connection member 110, which is provided by way of example to thus be variously modified and may be formed to have different functions, according to forms thereof.

The second connection member 110 may be configured of an insulating layer 111. A material of the insulating layer 111 is not particularly limited. For example, an insulating material may be used. As the insulating material, a thermosetting resin such as an epoxy resin, a thermoplastic resin such as polyimide, or a resin in which the resins described above and an inorganic filler are impregnated with a core material such as glass fiber, glass cloth, glass fabric, or the like, for example, a prepreg, an unclad CCL, or the like may be used, but an exemplary embodiment is not limited thereto.

Although not illustrated in the drawings, a metal layer may further be disposed on an inner wall of the through hole 110H of the second connection member 110, as needed. For example, the periphery of a side surface of the semiconductor chip 120 may also be surrounded by the metal layer. Heat generated from the semiconductor chip 120 through the metal layer may be effectively radiated to the upper and/or lower portions of the fan-out semiconductor package 100A, thereby effectively shielding electromagnetic wave. In addition, a plurality of semiconductor chips may be disposed in the through hole 110H of the second connection member 110 as needed, and the through hole 110H of the second connection member 110 may be provided as a plurality of through holes. The semiconductor chips may also be disposed in the through holes, respectively. In addition to the semiconductor chips, separate passive components such as a capacitor, an inductor, and the like may be sealed together in the through hole 110H. In addition, a surface-mounted component may be mounted on the passivation layer 150 to be located on substantially the same plane as the connection terminal 170.

The fan-out semiconductor package 100A according to the exemplary embodiments described above may be mounted on a printed circuit board 200 commonly known in the art via the connection terminals 170. The printed circuit board 200 may be a main board, or the like, of an electronic device, but is not limited thereto. For example, in general, when a semiconductor package is mounted on a printed circuit board, a problem in terms of reliability thereof may occur as described above. However, in the case of the fan-out semiconductor package 100A according to an exemplary embodiment, the under-bump metal layer 160 may be employed, and a size of the second via 163 of the under-bump metal layer 160 may also be reduced to be prevented from overlapping the first via 143 of the connection member 140. Thus, even when the semiconductor package is mounted on the printed circuit board 200, reliability thereof may be improved.

Figure 11:
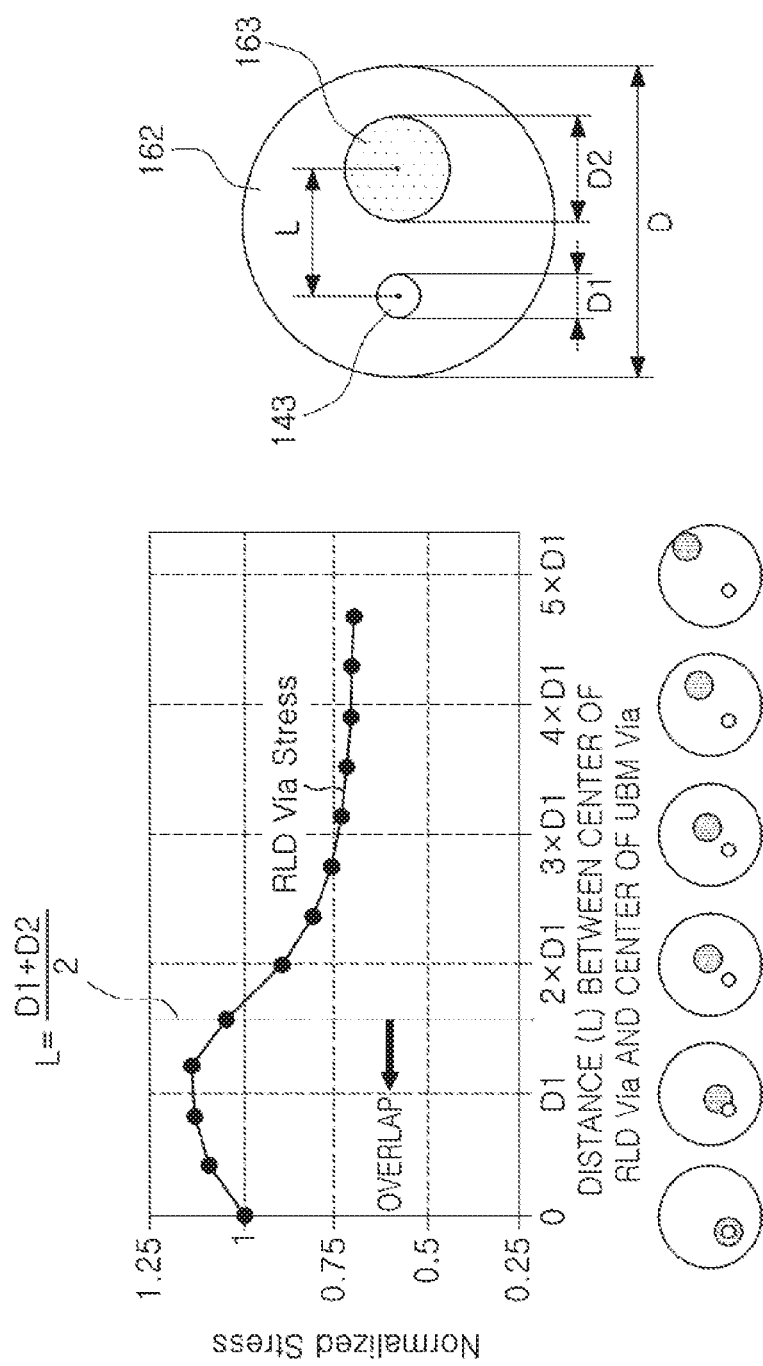
FIG. 11 schematically illustrates a change in stress applied to a via of a redistribution layer depending on a distance between a central axis of the via of the redistribution layer and a central axis of a via of an under-bump metal layer.

FIG. 11 schematically illustrates a change in stress applied to a via of a redistribution layer depending on a distance between a central axis of the via of the redistribution layer and a central axis of a via of an under-bump metal layer.

Referring to FIG. 11, when the central axes of the first via 143 and the second via 163 are close to each other as a result of a drop simulation to overlap each other, it can be seen that stress applied to the first via 143 increases sharply. For example, when a diameter of the first via 143 is D1, a diameter of the second via 163 is D2, and a distance between a central axis of the first via 143 and a central axis of the second via 163 is L, in order that the first via 143 and the second via 163 are prevented from overlapping each other, $(D1+D2)/2 < L$ may be satisfied. On the other hand, if the first via 143 and/or the second via 163 are outside of a region in which the external connection pad 162 is disposed, a side effect may occur. Thus, for example, when a diameter of the external connection pad 162 is D, $L < [D-(D1+D2)/2]$ may also be satisfied. Central axes of the first via 143 and the second via 163 may be disposed on a diameter of the external connection pad 162.

Figure 12:
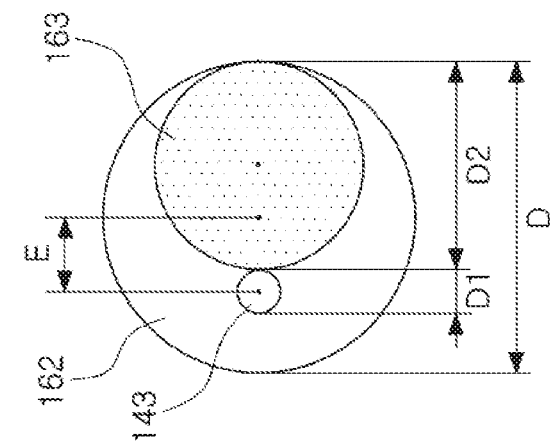
FIG. 12 schematically illustrates a change in stress applied to a via of a redistribution layer and a via of an under-bump metal layer depending on a diameter of the via of the under-bump metal layer.
Figure 12:
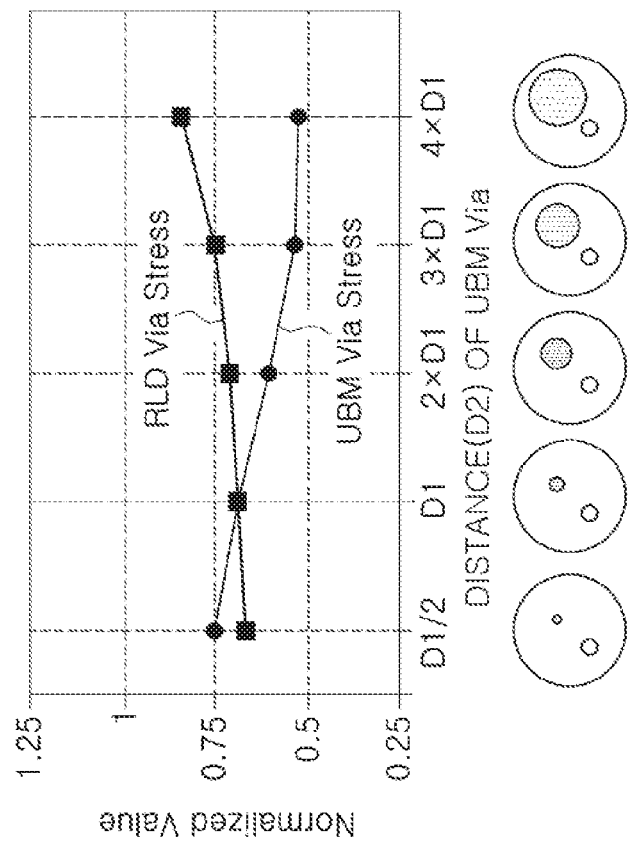

FIG. 12 schematically illustrates a change in stress applied to a via of a redistribution layer and a via of an under-bump metal layer depending on a diameter of the via of the under-bump metal layer.

Referring to FIG. 12, even when the first via 143 and second via 163 do not overlap as a result of a drop simulation, the diameter of the second via 163 is gradually reduced to be less than the diameter of the first via 143, it can be seen that stress UBM of the second via 163 becomes higher than stress RLD of the first via 143. For example, when the diameter of the first via 143 is D1, the diameter of the second via 163 is D2, and the diameter of the external connection pad 162 is D, $D1 < D2$ may be satisfied. In a different manner, the first via 143 and the second via 163 should not overlap each other, and thus, when a distance between a central axis of the first via 143 and a central axis of the external connection pad 162 is E, $D2 < (D/2+E-D1/2)$ may also be satisfied.

Figure 13:
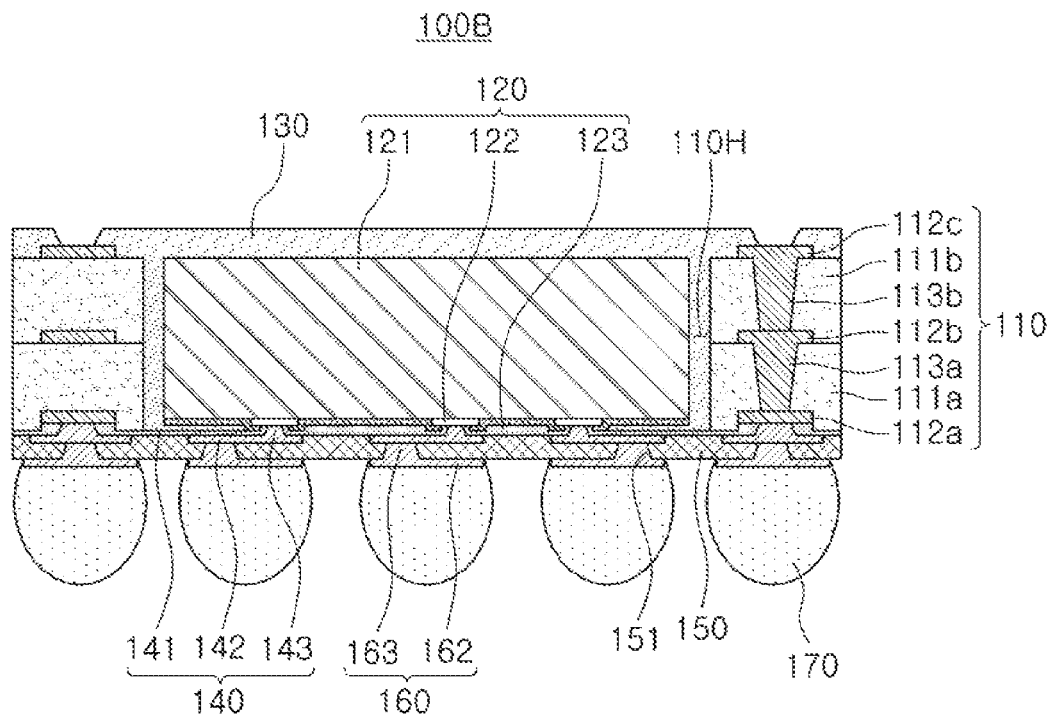
FIG. 13 schematically illustrates a modified example of the fan-out semiconductor package of FIG. 9.

FIG. 13 schematically illustrates a modified example of the fan-out semiconductor package of FIG. 9.

Referring to FIG. 13, a fan-out semiconductor package 100B according to a modified example may include a first insulating layer 111a allowing a second connection member 110 to contact a first connection member 140 thereby, a first redistribution layer 112a embedded in the first insulating layer 111a while contacting the first connection member 140, a second redistribution layer 112b opposing the first redistribution layer 112a embedded in the first insulating layer 111a, a second insulating layer 111b disposed on the first insulating layer 111a to cover the second redistribution layer 112b, and a third redistribution layer 112c disposed on the second insulating layer 111b. The first to third redistribution layers 112a, 112b and 112c may be electrically connected to the connection pad 122. The first and second redistribution layers 112a and 112b and the second and third redistribution layers 112b and 112c may be electrically connected to one another via first and second vias 113a and 113b penetrating through the first and second insulating layers 111a and 111b, respectively. The fan-out semiconductor package 100B according to the modified example may be used as a portion of a package-on-package by the second connection member 110. In this case, an encapsulant 130 may have an opening allowing for exposure of at least a portion of the third redistribution layer 112c.

Since the first redistribution layer 112a is embedded, an insulation distance of an insulating layer 141 of the first connection member 140 may be substantially constant. Since the second connection member 110 includes a relatively large number of redistribution layers 112a, 112b and 112c, the first connection member 140 may be further simplified. Thus, a reduction in yield due to defects occurring in a process of forming the first connection member 140 may be decreased. The first redistribution layer 112a may be recessed into the first insulating layer, in such a manner that a lower surface of the first insulating layer 111a and a lower surface of the first redistribution layer 112a have a step portion therebetween. As a result, a material for the encapsulant 130 may be prevented from bleeding into and contaminating the first redistribution layer 112a therewith in forming the encapsulant 130.

The lower surface of the first redistribution layer 112a of the second connection member 110 may be located to be higher than a lower surface of a connection pad 122 of the semiconductor chip 120. In addition, a distance between a redistribution layer 142 of the first connection member 140 and the first redistribution layer 112a of the second connection member 110 may be greater than a distance between the redistribution layer 142 of the first connection member 140 and the connection pad 122 of the semiconductor chip 120, which may be provided based on the first redistribution layer 112a being recessed into the first insulating layer 111a. The second redistribution layer 112b of the second connection member 110 may be positioned between an active surface and an inactive surface of the semiconductor chip 120. The second connection member 110 may be formed to have a thickness corresponding to a thickness of the semiconductor chip 120, and thus, the second redistribution layer 112b formed within the second connection member 110 may be disposed at a position between the active surface and the inactive surface of the semiconductor chip 120.

A thickness of each of the redistribution layers 112a, 112b and 112c of the second connection member 110 may be greater than a thickness of the redistribution layer 142 of the first connection member 140. The second connection member 110 may have a thickness greater than that of the semiconductor chip 120, and the redistribution layers 112a, 112b, and 112c may also be formed to have a relatively great thickness to correspond to the thickness of the second connection member 110. In addition, the redistribution layer 142 of the first connection member 140 may be formed to have a relatively reduced size to provide the slimness.

Other configurations are substantially the same as those of the fan-out semiconductor package 100A described above according to the foregoing exemplary embodiment, and thus, a detailed description thereof will be omitted.

Figure 14:
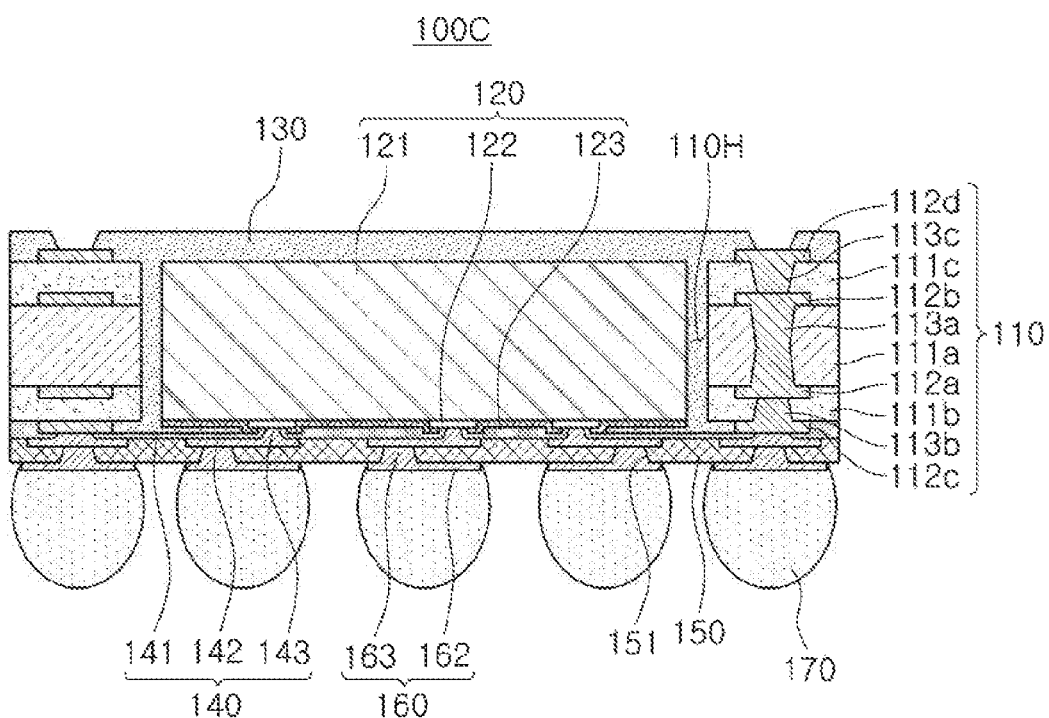
FIG. 14 schematically illustrates another modified example of the fan-out semiconductor package of FIG. 9.

FIG. 14 schematically illustrates another modified example of the fan-out semiconductor package of FIG. 9.

Referring to FIG. 14, a fan-out semiconductor package 100C according to a modified example may include a second connection member 110. The second connection member 110 may include a first insulating layer 111a, a first redistribution layer 112a and a second redistribution layer 112b respectively disposed on two surfaces of the first insulating layer 111a, a second insulating layer 111b disposed on the first insulating layer 111a to cover the first redistribution layer 112a, a third redistribution layer 112c disposed on the second insulating layer 111b, a third insulating layer 111c disposed on the first insulating layer 111a to cover the second redistribution layer 112b, and a fourth redistribution layer 112d formed on the third insulating layer 111c. The first to fourth redistribution layers 112a, 112b, 112c and 112d may be electrically connected to a connection pad 122 of a semiconductor chip 120. The second connection member 110 may include a relatively increased number of redistribution layers 112a, 112b, 112c and 112d, in such a manner that the first connection member 140 may further be simplified. Thus, a reduction in yield due to defects occurring in a process of forming the first connection member 140 may be decreased. The first to fourth redistribution layers 112a, 112b, 112c and 112d may be electrically connected to one another through first to third vias 113a, 113b and 113c penetrating through the first to third insulating layers 111a, 111b and 111c, respectively. The fan-out semiconductor package 100C according to the modified example may be used as a portion of a package-on-package by the second connection member 110. In this case, an encapsulant 130 may have an opening allowing for exposure of at least a portion of the fourth redistribution layer 112d.

The first insulating layer 111a may have a thickness greater than those of the second insulating layer 111b and the third insulating layer 111c. The first insulating layer 111a may have a relatively increased thickness to maintain rigidity thereof, and the second insulating layer 111b and the third insulating layer 111c may be employed to form a relatively increased number of redistribution layers, for example, 112c and 112d. The first insulating layer 111a may include an insulating material different from those of the second insulating layer 111b and the third insulating layer 111c. For example, the first insulating layer 111a may be, for example, a prepreg including a core material, an inorganic filler, and an insulating resin, and the second insulating layer 111b and the third insulating layer 111c may be an ABF film or a photosensitive insulating film including an inorganic filler and an insulation resin, but are not limited thereto. In a manner similar thereto, a dimension of the first via 113a may be greater than that of the second via 113b and the third via 113c.

A lower surface of the third redistribution layer 112c of the second connection member 110 may be located to be lower than a lower surface of the connection pad 122 of the semiconductor chip 120. In addition, a distance between the redistribution layer 142 of the first connection member 140 and the third redistribution layer 112c of the second connection member 110 may be less than a distance between the redistribution layer 142 of the first connection member 140 and the connection pad 122 of the semiconductor chip 120, which may be provided based on a structure in which the third redistribution layer 112c is disposed on the second insulating layer 111b in a protruding form to thus be in contact with the first connection member 140. The first redistribution layer 112a and the second redistribution layer 112b of the second connection member 110 may be positioned between an active surface and an inactive surface of the semiconductor chip 120. The second connection member 110 may be formed to have a thickness corresponding to a thickness of the semiconductor chip 120, and thus, the first redistribution layer 112a and the second redistribution layer 112b formed within the second connection member 110 may be disposed in a position between the active surface and the inactive surface of the semiconductor chip 120.

A thickness of each of the redistribution layers 112a, 112b, 112c and 112d of the second connection member 110 may be greater than a thickness of the redistribution layer 142 of the first connection member 140. The second connection member 110 may have a thickness greater than that of the semiconductor chip 120, and the redistribution layers 112a, 112b, 112c and 112d may also be formed to have a relatively great thickness to correspond to the thickness of the second connection member 110. In addition, the redistribution layer 142 of the first connection member 140 may be formed to have a relatively reduced size to provide the slimness.

Other configurations are substantially the same as those of the fan-out semiconductor package 100A described above according to the foregoing exemplary embodiment, and thus, a detailed description thereof will be omitted.

Figure 15:
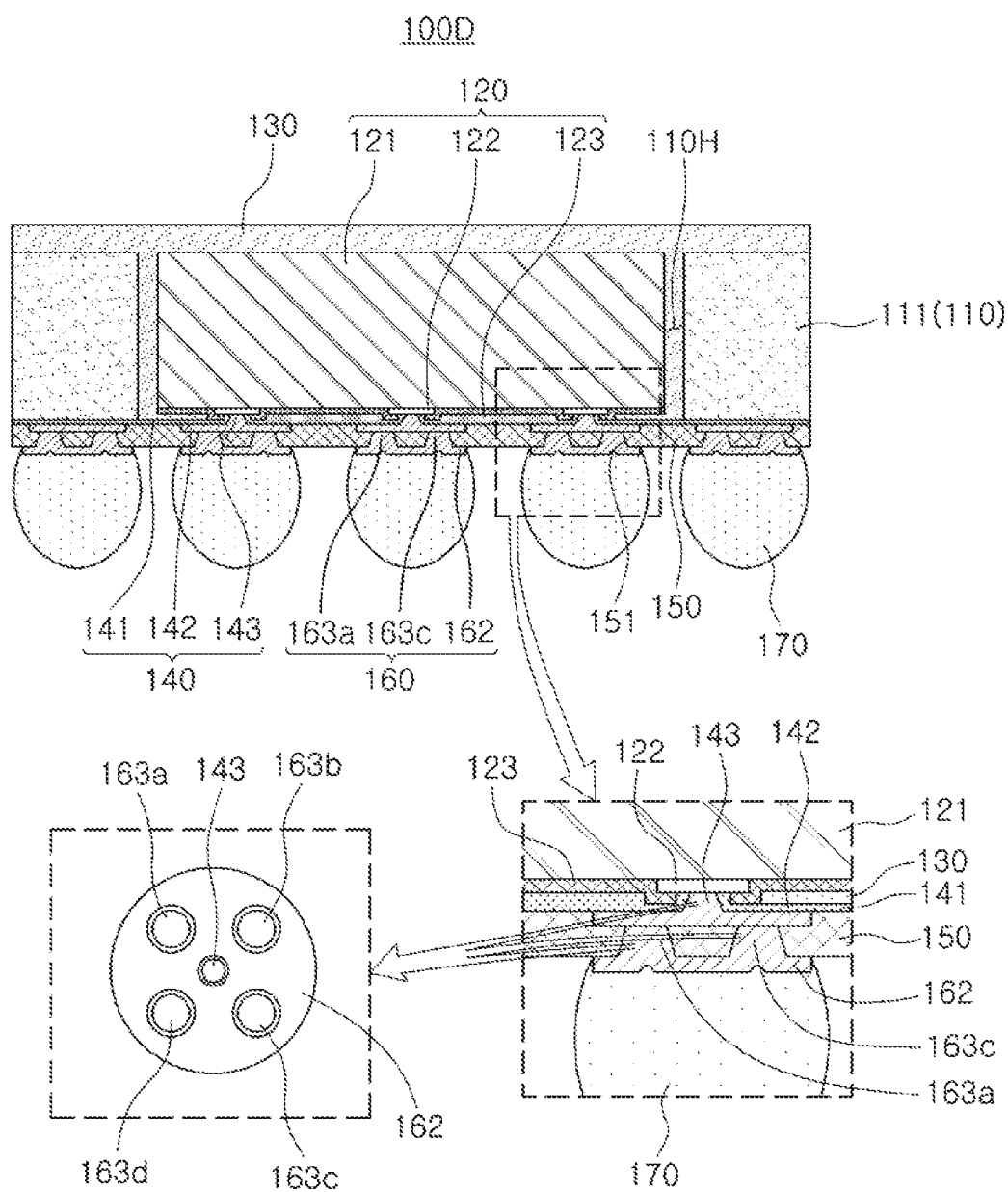
FIG. 15 schematically illustrates another example of a fan-out semiconductor package.

FIG. 15 schematically illustrates another example of a fan-out semiconductor package.

Referring to FIG. 15, a fan-out semiconductor package 100D according to another exemplary embodiment may include a semiconductor chip 120 having an active surface on which a connection pad 122 is disposed and an inactive surface opposing the active surface, an encapsulant 130 sealing at least a portion of the inactive surface of the semiconductor chip 120, a connection member 140 disposed on the active surface of the semiconductor chip 120, a passivation layer 150 disposed on the connection member 140, and an under-bump metal layer 160 disposed on the passivation layer 150. The connection member 140 may include a redistribution layer 142 and a first via 143 electrically connecting the redistribution layer 142 to the connection pad 122 of the semiconductor chip 120 to the redistribution layer 142. The under-bump metal layer 160 may include an external connection pad 162 formed on the passivation layer 150 and a plurality of second vias 163a, 163b, 163c and 163d electrically connecting the external connection pad 162 and the redistribution layer 142 to each other. The first via 143 and the plurality of second vias 163a, 163b, 163c and 163d may be located on a region in which the external connection pad 162 is disposed. For example, a plurality of second vias 163a, 163b, 163c and 163d may be disposed to correspond to one external connection pad 162. The first via 143 and the plurality of second vias 163a, 163b, 163c and 163d may be arranged while not overlapping each other on the region described above.

In a manner similar to that of the fan-out semiconductor package 100D according to the exemplary embodiment, for example, when the under-bump metal layer 160 including the plurality of second vias 163a, 163b, 163c and 163d connecting the external connection pad 162 and the redistribution layer 142 to each other is employed, stress may be dispersed through the plurality of second vias 163a, 163b, 163c and 163d. In addition, as a metal portion is increased via the metal vias 163a, 163b, 163c and 163d, sufficient resistance against stress may be secured. As a result, a problem related to board-level reliability as described above may be further reduced. Further, the number of the plurality of second vias 163a, 163b, 163c, and 163d is not limited to that illustrated in the drawings, but may be less or more.

On the other hand, a plurality of dimples may be formed on a surface of the external connection pad 162 to correspond to the plurality of second vias 163a, 163b, 163c, and 163d, respectively, and for example, the surface of the external connection pad 162 may be nonlinear. For example, when a plurality of dimples are formed on the surface of the external connection pad 162 to correspond to the plurality of second vias 163a, 163b, 163c and 163d, a contact interface between the under-bump metal layer 160 and the connection terminal 170 may be widened, and thus, a stress dispersion effect may be further improved. In addition, adhesion between the under-bump metal layer 160 and the connection terminal 170 may be improved by the widened contact interface, and reliability may be further improved.

Other configurations are substantially the same as those of the fan-out semiconductor package 100A described above according to the foregoing exemplary embodiment, and thus, a detailed description thereof will be omitted.

Figure 16:
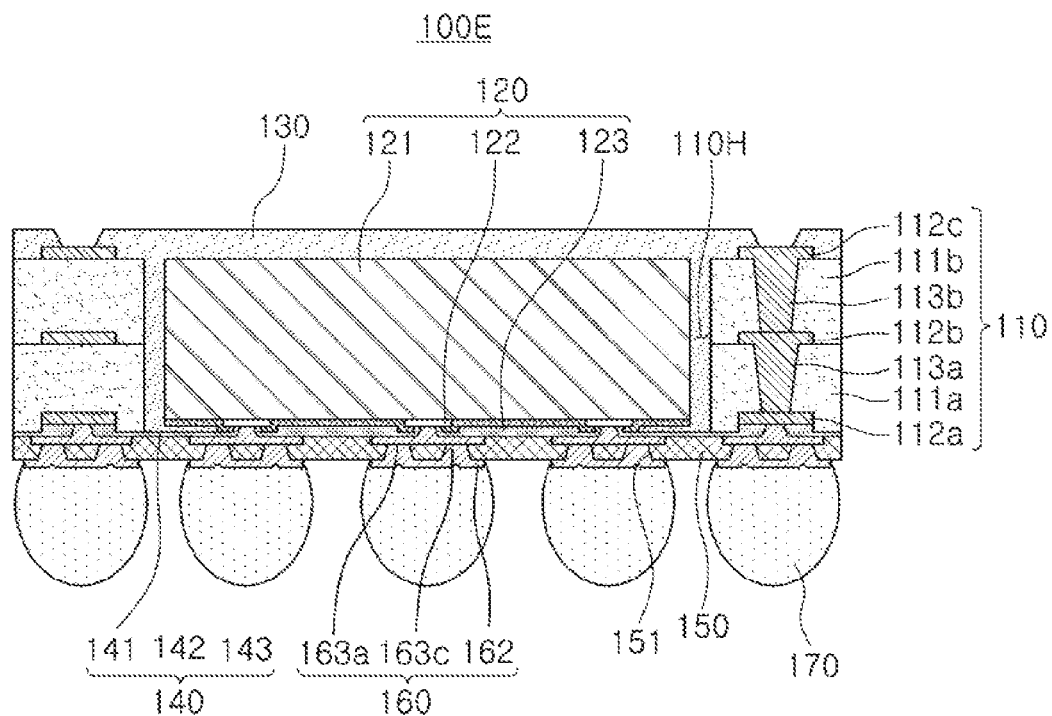
FIG. 16 schematically illustrates a modified example of the fan-out semiconductor package of FIG. 15.

FIG. 16 schematically illustrates a modified example of the fan-out semiconductor package of FIG. 15.

Referring to FIG. 16, a fan-out semiconductor package 100E according to a modified example may include a second connection member 110. The second connection member 110 may include a first insulating layer 111a in contact with a first connection member 140, a first redistribution layer 112a embedded in the first insulating layer 111a while contacting the first connection member 140, a second redistribution layer 112b opposing the first redistribution layer 112a embedded in the first insulating layer 111a, a second insulating layer 111b disposed on the first insulating layer 111a to cover the second redistribution layer 112b, and a third redistribution layer 112c disposed on the second insulating layer 111b. The first to third redistribution layers 112a, 112b and 112c may be electrically connected to the connection pad 122. In addition, the first and second redistribution layers 112a and 112b and the second and third redistribution layers 112b and 112c may be electrically connected to one another via first and second vias 113a and 113b penetrating through the first and second insulating layers 111a and 111b, respectively.

Other configurations are substantially the same as those of the fan-out semiconductor package 100A according to the exemplary embodiment, the fan-out semiconductor package 100B according to the modified example, and the fan-out semiconductor package 100D according to another exemplary embodiment, described above, and thus, a detailed description thereof will be omitted.

Figure 17:
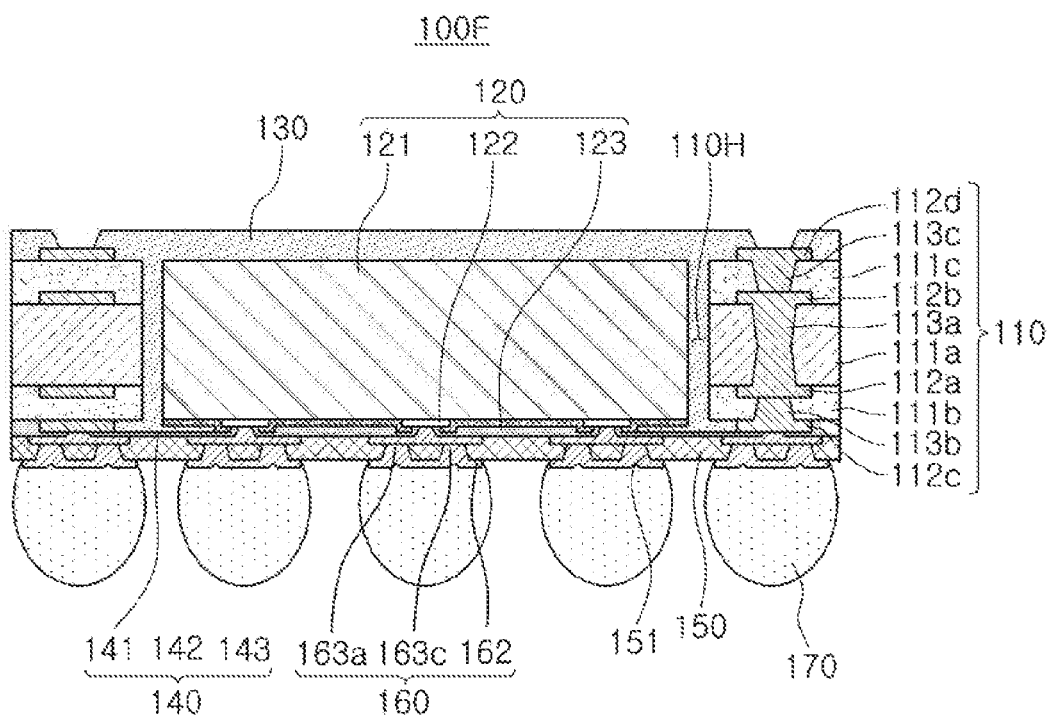
FIG. 17 schematically illustrates another modified example of the fan-out semiconductor package of FIG. 15.

FIG. 17 schematically illustrates another modified example of the fan-out semiconductor package of FIG. 15.

Referring to FIG. 17, a fan-out semiconductor package 100F according to a modified example may include a second connection member 110. The second connection member 110 may include a first insulating layer 111a, a first redistribution layer 112a and a second redistribution layer 112b respectively disposed on two surfaces of the first insulating layer 111a, a second insulating layer 111b disposed on the first insulating layer 111a to cover the first redistribution layer 112a, a third redistribution layer 112c disposed on the second insulating layer 111b, a third insulating layer 111c disposed on the first insulating layer 111a to cover the second redistribution layer 112b, and a fourth redistribution layer 112d formed on the third insulating layer 111c. The first to fourth redistribution layers 112a, 112b, 112c and 112d may be electrically connected to a connection pad 122. The second connection member 110 may include a relatively increased number of redistribution layers 112a, 112b, 112c and 112d, in such a manner that the first connection member 140 may further be simplified. Thus, a reduction in yield due to defects occurring in a process of forming the first connection member 140 may be decreased. The first to fourth redistribution layers 112a, 112b, 112c and 112d may be electrically connected to one another through first to third vias 113a, 113b and 113c penetrating through the first to third insulating layers 111a, 111b and 111c, respectively.

Other configurations are substantially the same as those of the fan-out semiconductor package 100A according to the exemplary embodiment, the fan-out semiconductor package 100C according to the modified example, and the fan-out semiconductor package 100D according to another exemplary embodiment, described above, and thus, a detailed description thereof will be omitted.

As set forth above, according to an exemplary embodiment, a fan-out semiconductor package having sufficient reliability against stress transferred through a connection terminal and the like may be provided.

The meaning of 'being connected' in the present disclosure includes not only a direct connection but also an indirect connection through an adhesive layer or the like. In addition, the term 'electrically connected' means a concept including both a physical connection and a non-connection. Further, the first and second expressions are used to distinguish one component from another component and do not limit the order and/or importance of components and the like. In some cases, without departing from the scope of the rights, a first component may be referred to as a second component, and similarly, a second component may also be referred to as a first component.

The expressions 'exemplary embodiment', 'example', and the like used in the present disclosure do not mean the same embodiment, but are provided for emphatically describing different specific features. However, the above-mentioned examples and exemplary embodiments do not exclude that they are implemented in combination with the features of other examples. For example, even in the case in which the description in a particular example is not provided in another example, the description may be understood as an explanation related to another example, unless otherwise stated or contrary to the description in other examples.

The terminology used in the present disclosure is used only to illustrate an example and is not intended to limit the disclosure. The singular expressions include plural expressions unless the context clearly dictates otherwise.

While example embodiments have been shown and described above, it will be apparent to those skilled in the art that modifications and variations could be made without departing from the scope of the present disclosure as defined by the appended claims.

What is claimed is:

1. A fan-out semiconductor package comprising:
a semiconductor chip having an active surface on which a plurality of connection pads are disposed and an inactive surface opposing the active surface;
an encapsulant sealing at least a portion of the semiconductor chip;
a first connection member disposed on the active surface of the semiconductor chip, and including a first wiring layer and a plurality of first via, each electrically connecting the first wiring layer to one of the plurality of connection pads;
an insulating layer disposed on the first connection member; and
a second wiring layer including a plurality of external connection pads disposed on the insulating layer and a plurality of second vias, each connecting the first wiring layer to one of the external connection pads,
wherein in a direction perpendicular to the active surface of the semiconductor chip, each of the external connection pads has a circular shape, for each of the external connection pads, the first via and the second via are disposed within the external connection pad and do not overlap each other,
wherein, for each of the external connection pads, central axes of the first via, the second via, and the external connection pad are offset from one another.

2. The fan-out semiconductor package of claim 1, wherein each of the second via has a volume greater than a volume of each of the first via.

3. The fan-out semiconductor package of claim 1, wherein, for each of the external connection pads, (D1+D2)/2<L<[D−(D1+D2)/2] is satisfied, in which D1 is a diameter of the first via, D2 is a diameter of the second via, D is a diameter of the external connection pad, and L is a distance between the central axis of the first via and the central axis of the second via.

4. The fan-out semiconductor package of claim 1, wherein, for each of the external connection pads, D1<D2< (D/2+E−D1/2) is satisfied, in which D1 is a diameter of the first via, D2 is a diameter of the second via, D is a diameter of the external connection pad, and E is a distance between the central axis of the first via and the central axis of the external connection pad.

5. The fan-out semiconductor package of claim 1, wherein, for each of the external connection pads, central axes of the first via and the second via are disposed on a diameter of the external connection pad.

6. The fan-out semiconductor package of claim 1, wherein, for each of the external connection pads, the first via is provided as a plurality of first vias corresponding to the external connection pad.

7. The fan-out semiconductor package of claim 6, wherein at least one of the plurality of first vias is a via for a signal, and the remaining is at least one of a via for power connection and a via for ground connection.

8. The fan-out semiconductor package of claim 1, wherein, for each of the external connection pads, the second via is provided as a plurality of second vias corresponding to the external connection pad.

9. The fan-out semiconductor package of claim 8, wherein, for each of the external connection pads, the external connection pad is provided with a plurality of dimples formed in a surface of the external connection pad and corresponding to the plurality of second vias, respectively.

10. The fan-out semiconductor package of claim 1, further comprising a second connection member having a through hole,
wherein the semiconductor chip is disposed in the through hole of the second connection member.

11. The fan-out semiconductor package of claim 10, wherein the second connection member comprises a first insulating layer, a first redistribution layer embedded in the first insulating layer while contacting the first connection member, and a second redistribution layer opposing the first redistribution layer embedded in the first insulating layer; and the first and second redistribution layers are electrically connected to the connection pad.

12. The fan-out semiconductor package of claim 10, wherein the second connection member comprises a first insulating layer, a first redistribution layer and a second redistribution layer respectively disposed on two surfaces of the first insulating layer, a second insulating layer disposed on the first insulating layer to cover the first redistribution layer, and a third redistribution layer disposed on the second insulating layer; and the first to third redistribution layers are electrically connected to the connection pad.

13. The fan-out semiconductor package of claim 1, wherein an area of each of the second via projected onto a plane parallel to the active surface of the semiconductor chip is greater than an area of each of the first via projected onto the plane parallel to the active surface of the semiconductor chip.

14. The fan-out semiconductor package of claim 1, wherein, for each of the external connection pads, the external connection pad and the second via are an integral layer without any boundary therebetween.

15. A fan-out semiconductor package comprising:
- a connection member including a first wiring layer and a first via;
- a semiconductor chip disposed above the connection member, and including a connection pad, the first via electrically connecting the connection pad to the first wiring layer;
- an insulating layer disposed below the connection member; and
- a conductive layer including a pad pattern disposed below the insulating layer and a second via connecting the pad pattern to the first wiring layer, wherein $(D1+D2)/2 < L < [D-(D1+D2)/2]$ and $D1 < D2 < (D/2+E-D1/2)$ are satisfied, in which D1 is a diameter of the first via, D2 is a diameter of the second via, D is a diameter of the pad pattern, L is a distance between the central axis of the first via and the central axis of the second via, and E is a distance between the central axis of the first via and the central axis of the pad pattern.

16. The fan-out semiconductor package of claim 15, further comprising a conductive post disposed above the connection member, and disposed next to the semiconductor chip,
wherein the conductive post is electrically connected to the first wiring layer.

17. The fan-out semiconductor package of claim 16, wherein at least a portion of the conductive post is covered by an insulating material.

18. The fan-out semiconductor package of claim 15, further comprising a connection terminal disposed below the insulating layer and connected to the pad pattern, wherein a bottom surface of the pad pattern and at least a portion of a side surface of the pad pattern are covered by the connection terminal.

19. The fan-out semiconductor package of claim 15, further comprising an encapsulant covering at least a portion of the semiconductor chip.

* * * * *